US012685052B2

(12) United States Patent
Lin et al.

(10) Patent No.: US 12,685,052 B2
(45) Date of Patent: Jul. 14, 2026

(54) LOW PRESSURE PLASMA ETCH PROCESS FOR PREFERENTIAL GENERATION OF OXIDE RESIDUE AND APPLICATIONS FOR THE SAME

(71) Applicant: Taiwan Semiconductor Manufacturing Company Limited, Hsinchu (TW)

(72) Inventors: Tzu-Ging Lin, Kaohsiung City (TW); Jih-Jse Lin, Sijhih City (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 610 days.

(21) Appl. No.: 18/303,283

(22) Filed: Apr. 19, 2023

(65) Prior Publication Data

US 2024/0355629 A1 Oct. 24, 2024

(51) Int. Cl.
| | |
|---|---|
| *H10P 50/24* | (2026.01) |
| *H01J 37/32* | (2006.01) |
| *H10D 64/27* | (2025.01) |
| *H10D 84/83* | (2025.01) |
| *H10D 86/40* | (2025.01) |
| *H10D 86/60* | (2025.01) |
| *H10P 76/00* | (2026.01) |
| *H10W 20/00* | (2026.01) |

(52) U.S. Cl.
CPC ...... *H10P 50/242* (2026.01); *H01J 37/32449* (2013.01); *H01J 37/32678* (2013.01); *H10D 64/311* (2025.01); *H10D 84/834* (2025.01);

*H10D 86/451* (2025.01); *H10D 86/60* (2025.01); *H10P 76/00* (2026.01); *H10W 20/081* (2026.01)

(58) Field of Classification Search
None
See application file for complete search history.

(56) References Cited

U.S. PATENT DOCUMENTS

| | | | |
|---|---|---|---|
| 2021/0083072 A1* | 3/2021 | Feng | H10D 84/038 |
| 2021/0376095 A1* | 12/2021 | Chen | H10D 30/6219 |

* cited by examiner

*Primary Examiner* — Stephanie P Duclair
(74) *Attorney, Agent, or Firm* — The Marbury Law Group, PLLC

(57) ABSTRACT

A semiconductor structure may be provided by: forming semiconductor fins over a semiconductor substrate; forming a gate dielectric layer and gate electrodes; forming a silicon layer over the gate electrodes; forming a dielectric mask layer including openings over the silicon layer; etching portions of the silicon layer that underlie the openings by performing a first anisotropic etch process; etching portions of the gate electrodes that underlie the openings by performing a second anisotropic etch process; and removing portions of the semiconductor fins and portions of the semiconductor substrate that underlie the openings by performing a third anisotropic etch process. At least one anisotropic etch step within the third anisotropic etch process comprises at least one low pressure etch step that is performed at a total pressure in a range from 5 mTorr to 50 mTorr.

20 Claims, 30 Drawing Sheets

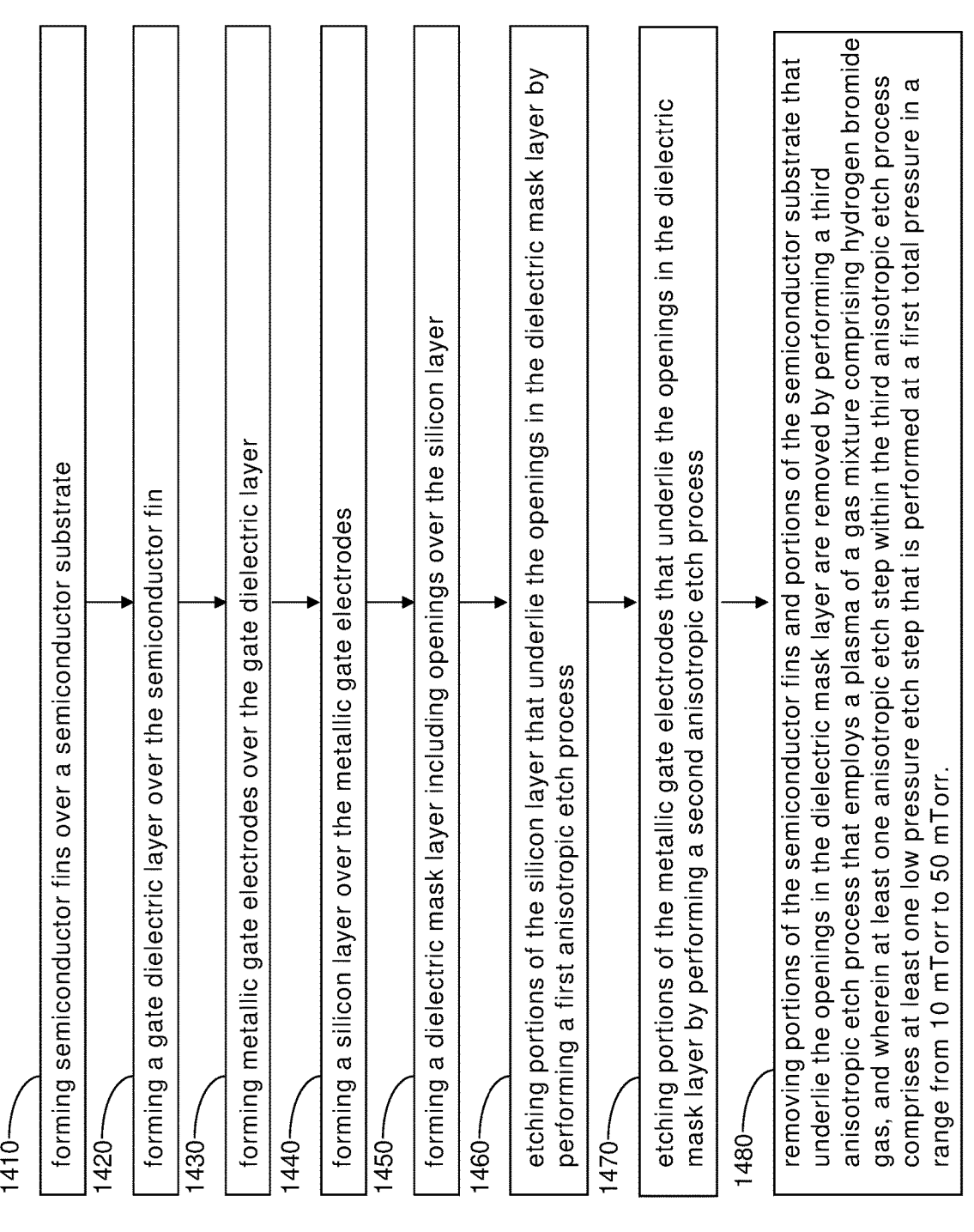

1410 — forming semiconductor fins over a semiconductor substrate

1420 — forming a gate dielectric layer over the semiconductor fin

1430 — forming metallic gate electrodes over the gate dielectric layer

1440 — forming a silicon layer over the metallic gate electrodes

1450 — forming a dielectric mask layer including openings over the silicon layer 1460 — etching portions of the silicon layer that underlie the openings in the dielectric mask layer by performing a first anisotropic etch process 1470 — etching portions of the metallic gate electrodes that underlie the openings in the dielectric mask layer by performing a second anisotropic etch process 1480 — removing portions of the semiconductor fins and portions of the semiconductor substrate that underlie the openings in the dielectric mask layer are removed by performing a third anisotropic etch process that employs a plasma of a gas mixture comprising hydrogen bromide gas, and wherein at least one anisotropic etch step within the third anisotropic etch process comprises at least one low pressure etch step that is performed at a first total pressure in a range from 10 mTorr to 50 mTorr.

FIG. 14

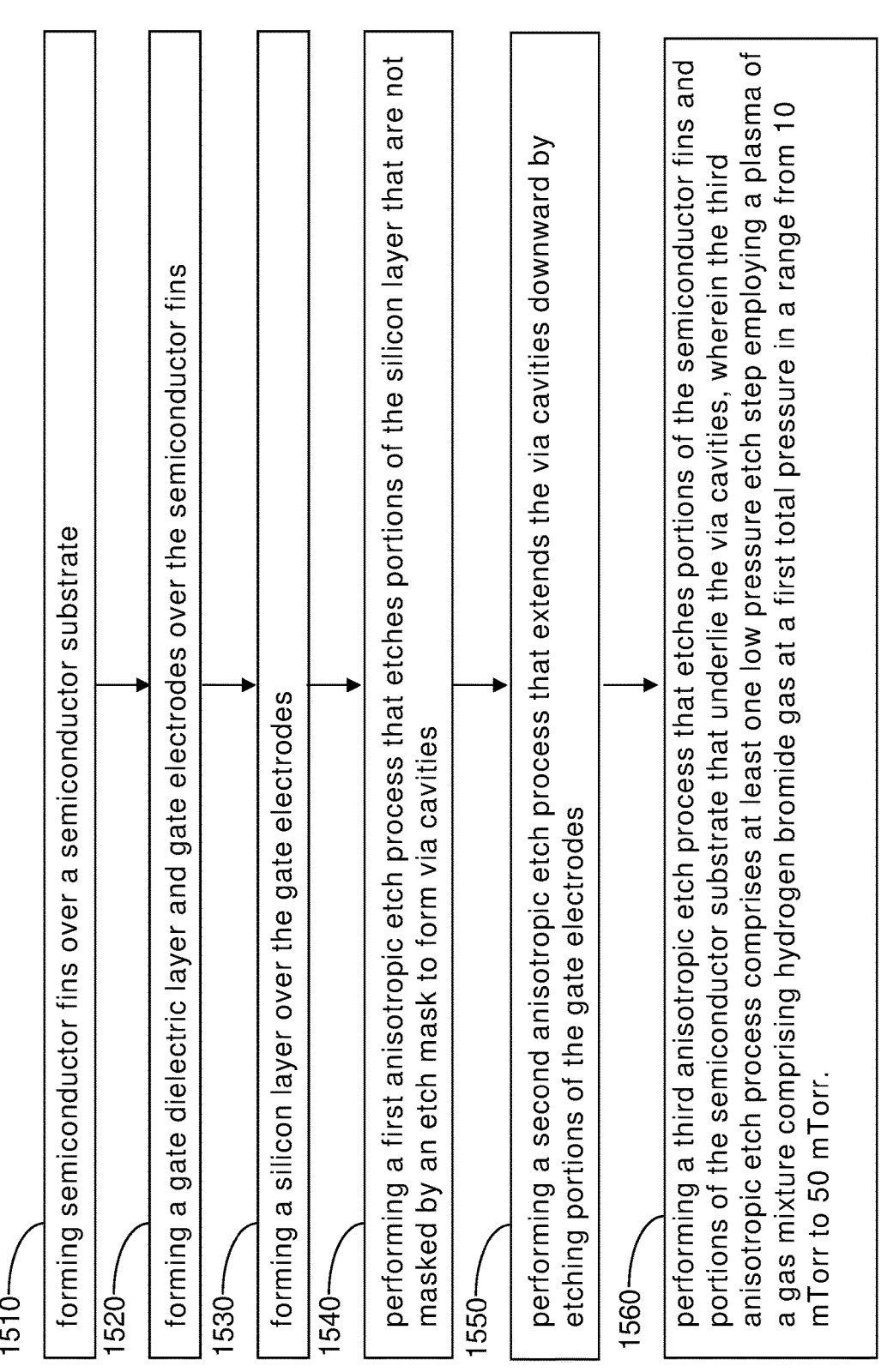

1510 — forming semiconductor fins over a semiconductor substrate

1520 — forming a gate dielectric layer and gate electrodes over the semiconductor fins 1530 — forming a silicon layer over the gate electrodes 1540 — performing a first anisotropic etch process that etches portions of the silicon layer that are not masked by an etch mask to form via cavities 1550 — performing a second anisotropic etch process that extends the via cavities downward by etching portions of the gate electrodes 1560 — performing a third anisotropic etch process that etches portions of the semiconductor fins and portions of the semiconductor substrate that underlie the via cavities, wherein the third anisotropic etch process comprises at least one low pressure etch step employing a plasma of a gas mixture comprising hydrogen bromide gas at a first total pressure in a range from 10 mTorr to 50 mTorr.

FIG. 15

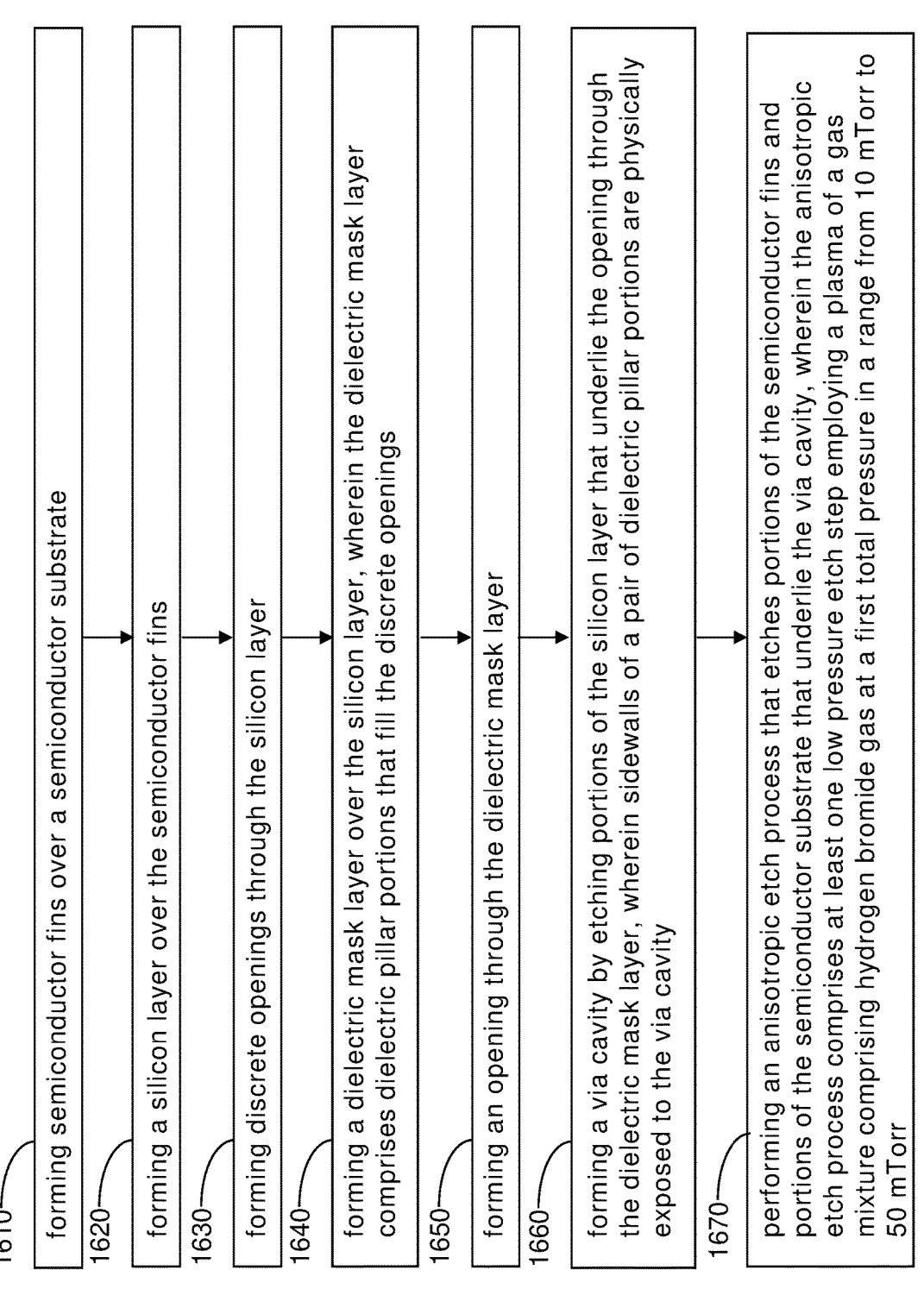

1610 — forming semiconductor fins over a semiconductor substrate

1620 — forming a silicon layer over the semiconductor fins

1630 — forming discrete openings through the silicon layer

1640 — forming a dielectric mask layer over the silicon layer, wherein the dielectric mask layer comprises dielectric pillar portions that fill the discrete openings 1650 — forming an opening through the dielectric mask layer 1660 — forming a via cavity by etching portions of the silicon layer that underlie the opening through the dielectric mask layer, wherein sidewalls of a pair of dielectric pillar portions are physically exposed to the via cavity 1670 — performing an anisotropic etch process that etches portions of the semiconductor fins and portions of the semiconductor substrate that underlie the via cavity, wherein the anisotropic etch process comprises at least one low pressure etch step employing a plasma of a gas mixture comprising hydrogen bromide gas at a first total pressure in a range from 10 mTorr to 50 mTorr

FIG. 16

LOW PRESSURE PLASMA ETCH PROCESS FOR PREFERENTIAL GENERATION OF OXIDE RESIDUE AND APPLICATIONS FOR THE SAME

BACKGROUND

Silicon etch processes are typically susceptible to local depth nonuniformity due to local variations in the pattern factor. In a silicon etch process, local depth nonuniformity problems may occur due to variations in the pattern factor. Variations in the pattern factor refers to the ratio of the open area to the total area of the pattern being etched. In instances in which the pattern factor varies across the wafer, the etch rate may be affected. This may result in variations in the depth of the etch. This in turn may result in non-uniformity in the final product, which may be problematic for the performance and functionality of the device being manufactured.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 is a first flow chart illustrating a first sequence of processing steps according to an embodiment of present disclosure.

FIG. 15 is a second flow chart illustrating a second sequence of processing steps according to an embodiment of present disclosure.

FIG. 16 is a third flow chart illustrating a third sequence of processing steps according to an embodiment of present disclosure.

DETAILED DESCRIPTION

Figure 1A:
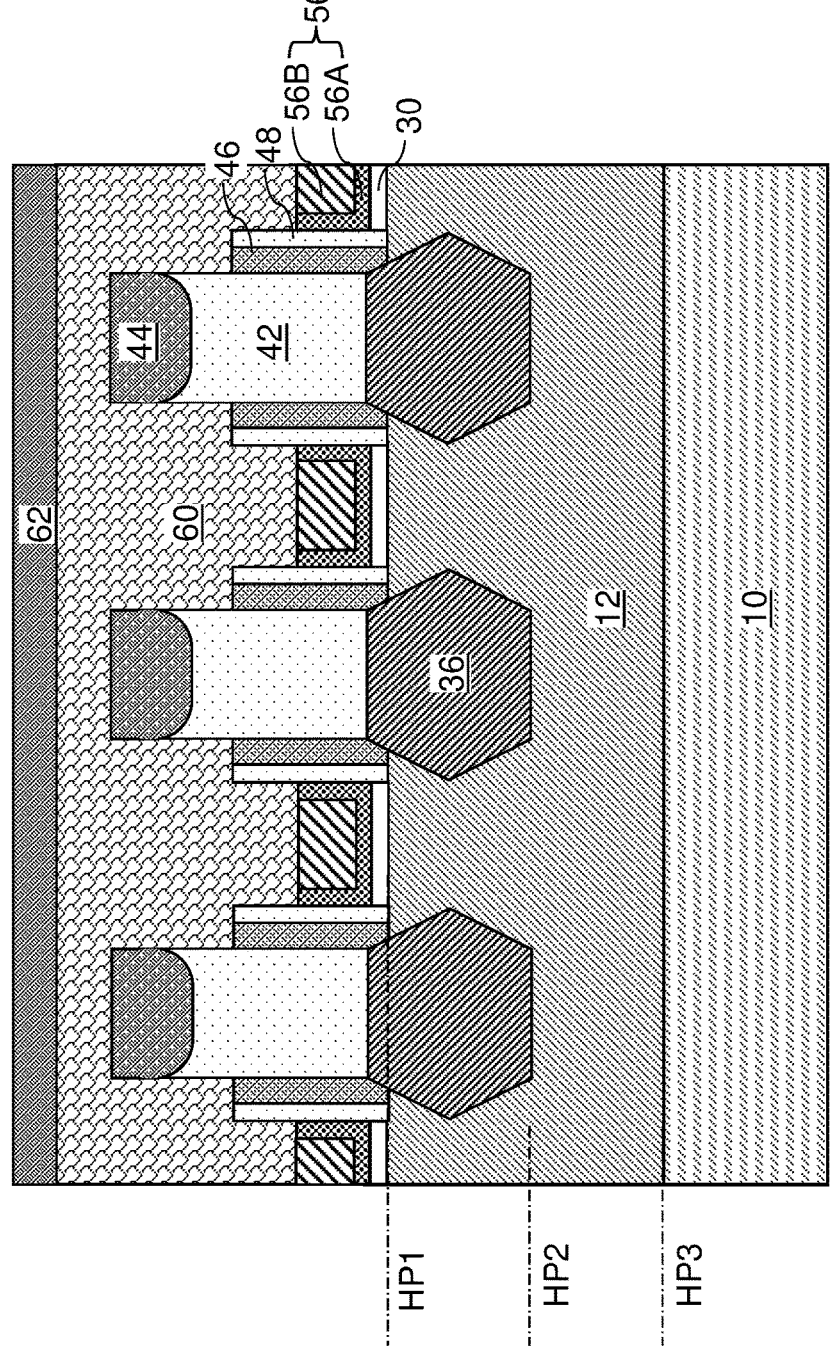
FIG. 1A is a first vertical cross-sectional view of an intermediate structure after formation of semiconductor fins, a gate dielectric layer, gate electrodes, a silicon layer, and a dielectric mask layer along a vertical plane that is parallel to a first horizontal direction according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to generally to semiconductor devices, and specifically to a method of providing electrical isolation from semiconductor fins used in fin field effect transistors (finFETs). A silicon layer may be formed over semiconductor fins and gate electrodes, and may be used as a component of an etch mask for patterning semiconductor fins of finFETs. A reactive ion etch process using a plasma may be performed to cut portions of the semiconductor fins underneath openings in the silicon layer. Portions of a semiconductor substrate that underlie the cut portions of the semiconductor fins may also etched to form trenches. The trenches may prevent leakage current between neighboring semiconductor fins through the semiconductor substrate.

Silicon etching has been performed using a polymer-rich etch process in which a predominant fraction of etch residues on sidewalls of trenches include a polymer material. With the growing demand for aggressive scaling of semiconductor fins (for example, with a pitch of 50 nm or less), depth control of trenches formed in the semiconductor substrate underneath the cut regions of the semiconductor fins becomes increasingly difficult. This is because the Knudsen number of the plasma etch process, as calculated as the ratio of the molecular mean free path of the reactive ions to a length of the trenches varies depending on the lateral dimensions (i.e., the lengths) of cuts in the semiconductor fins along a widthwise direction of the semiconductor fins, and causes variability in the depths of the trenches. The variability of the depths of the trenches is exacerbated by variability in the loading of polymer-rich dry etch processes and by photoresist peeling during the lithography processes. Particularly, a small lateral dimension of the cut region for the semiconductor fins causes unacceptably shallow trenches in the semiconductor substrate.

Embodiments of the present disclosure provide a plasma etch process providing substantially uniform etch depth that is independent of a local pattern factor for the trenches (i.e., the ratio of the area of the trenches to the total area within a given local region). Specifically, various embodiments of the present disclosure provide a plasma etch process in which a predominant fraction of etch residue on sidewalls of trenches is not a polymer material, but is a non-volatile silicon oxide-based material of which the thicknesses is generally independent of the local pattern factor of the trenches. Various embodiments of the present disclosure provide plasma etch processes for reducing variability in the depths of the trenches formed in the semiconductor substrate and for providing sufficient etch depths for increasing electrical isolation between neighboring pairs of semiconductor fins of fin field effect transistors.

Figure 1B:
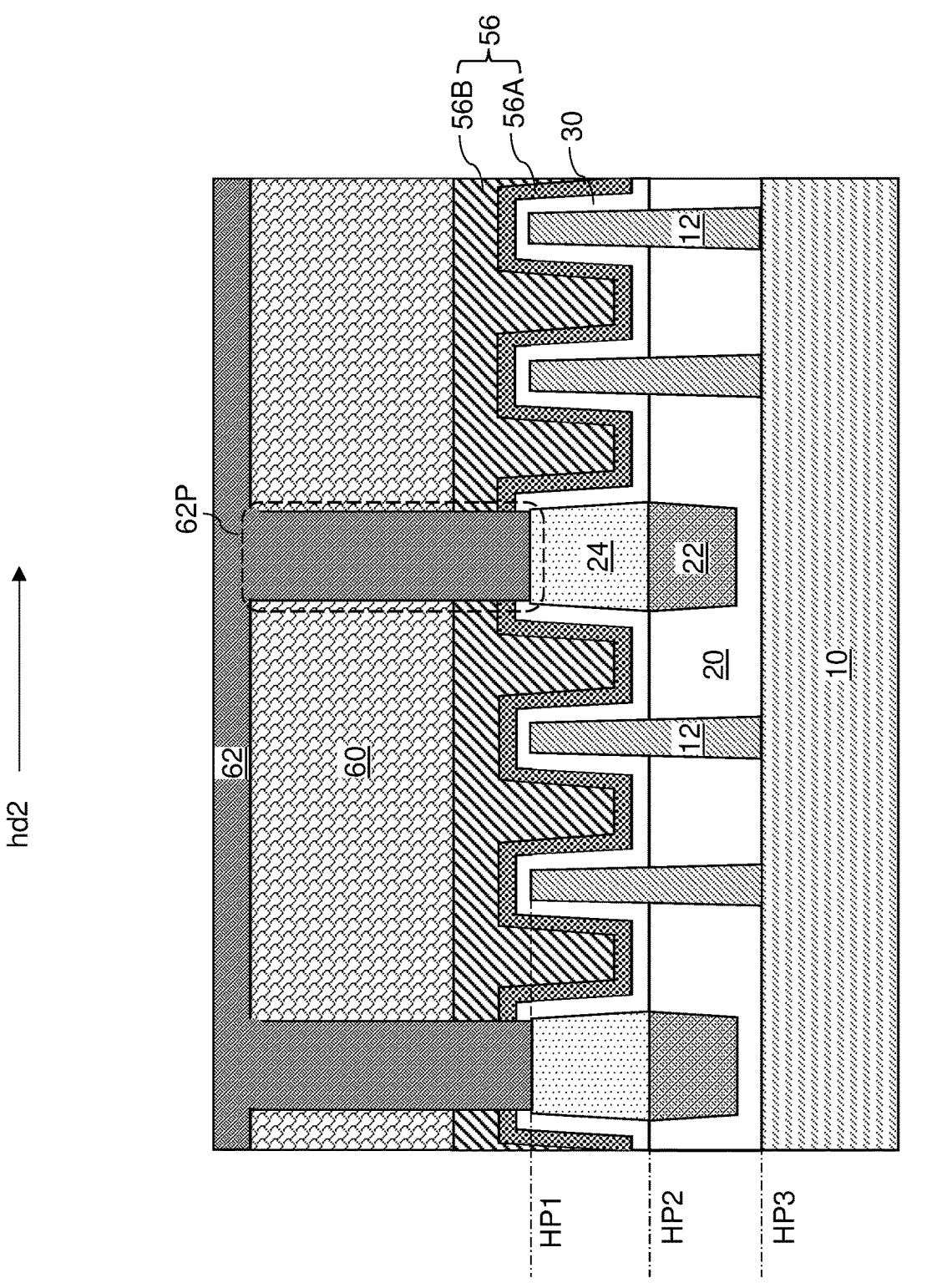
FIG. 1B is a second vertical cross-sectional view of the structure of FIG. 1A along a vertical plane that is parallel to a second horizontal direction that is perpendicular to the first horizontal direction.
Figure 1C:
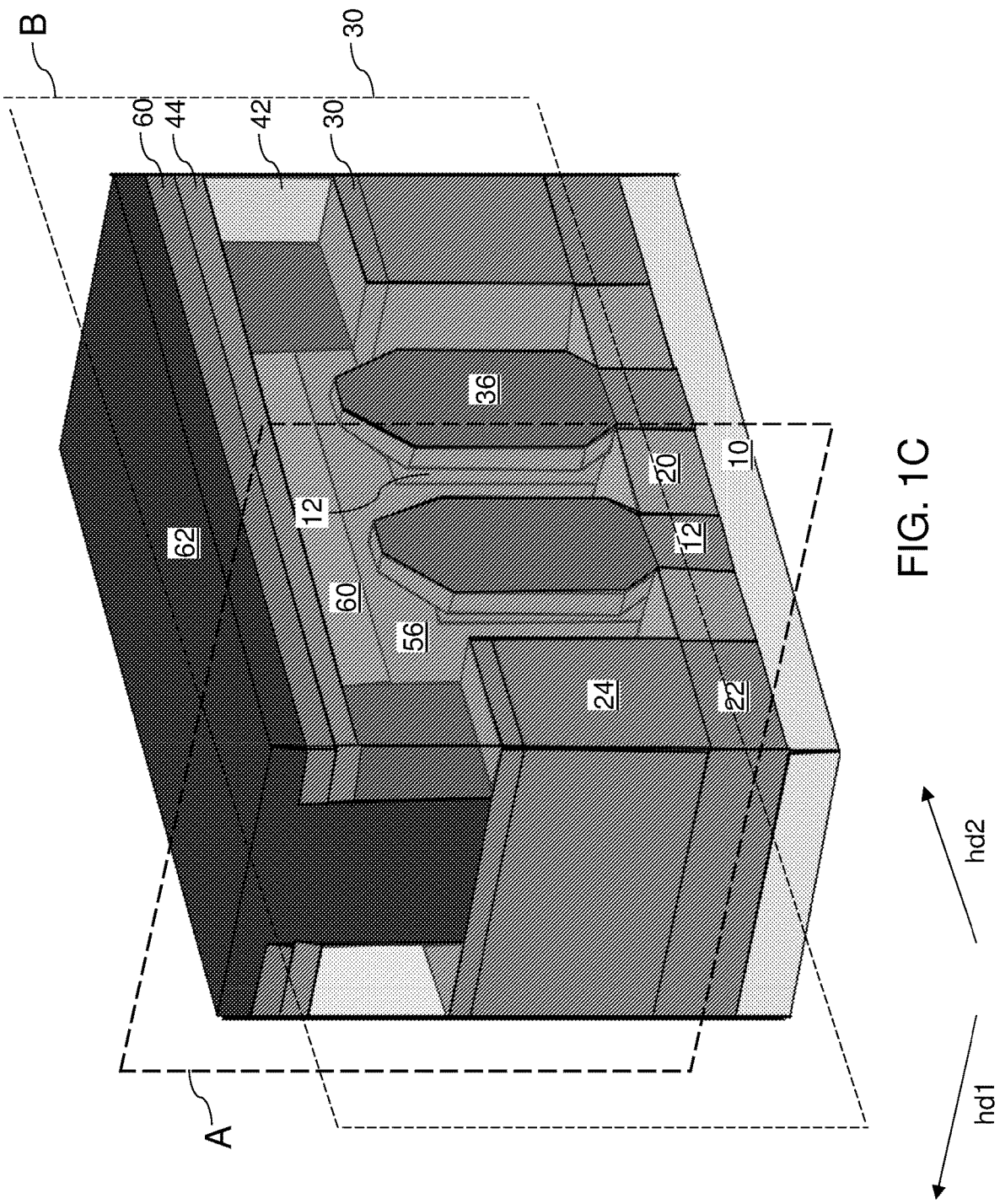
FIG. 1C is a perspective view of a box-shaped region of the intermediate structure of FIGS. 1A and 1B. The vertical plane A is the cut plane of the first vertical cross-sectional view of FIG. 1A. The vertical plane B is the cut plane of the second vertical cross-sectional plane of FIG. 1B.

Referring to FIGS. 1A-1C, an intermediate structure according to an embodiment of the present disclosure is illustrated. The intermediate structure comprises a semiconductor substrate 10, semiconductor fins 12 located on a top surface of the semiconductor substrate, a shallow trench isolation structure 20 that is formed over a top surface of the semiconductor substrate 10 and laterally surrounds the semiconductor fins 12, epitaxial source/drain regions 36 that are formed on a respective portion of the semiconductor fins 12, first dielectric isolation structures (22, 24), second dielectric isolation structures (42, 44), first dielectric gate spacers 46, second dielectric gate spacers 48, gate dielectric layers 30, gate electrodes 56, a silicon layer 60, and a dielectric mask layer 62.

The semiconductor substrate 10 may comprise a single crystalline semiconductor material such as single crystalline silicon. In one embodiment, the semiconductor substrate 10 may be a portion of a single crystalline wafer such as a single crystalline silicon wafer. The semiconductor fins 12 may be formed by patterning an upper portion of a single crystalline wafer. Top surfaces of the semiconductor fins 12 may be formed within a same horizontal plane, which is herein referred to as a first horizontal plane HP1.

The shallow trench isolation structure 20 may be formed around the semiconductor fins 12 by depositing and planarizing a dielectric fill material such as silicon oxide, and by vertically recessing the dielectric fill material. A remaining portion of the dielectric fill material after a vertical recess may constitute the shallow trench isolation structure 20. A top surface of the shallow trench isolation structure 20 may be formed in a second horizontal plane HP2, which is located below the first horizontal plane HP1. An interface between the shallow trench isolation structure 20 and the semiconductor substrate 10 may be located within a third horizontal plane HP3 that underlies the second horizontal plane HP2.

Epitaxial source/drain regions 36 may be formed on the semiconductor fins 12, for example, by forming a dielectric mask layer over the semiconductor fins 12, and by performing a selective epitaxy process. Optionally, unmasked portions of the semiconductor fins 12 may be recessed prior to the selective epitaxy process. In one embodiment, the epitaxial source/drain regions 36 may be formed as a two-dimensional rectangular array. The dielectric mask layer may be subsequently removed.

The first dielectric isolation structures (22, 24) may be formed by depositing and patterning dielectric materials. The first dielectric isolation structures (22, 24) may laterally extend along the first horizontal direction hd1. In one embodiment, each of the first dielectric isolation structures (22, 24) may comprise a vertical stack of a silicon nitride rail structure 22 and a dielectric metal oxide rail structures 24.

The second dielectric isolation structures (42, 44) may be subsequently formed by depositing and patterning additional dielectric materials. The second dielectric isolation structures (42, 44) may laterally extend along the second horizontal direction hd2. In one embodiment, each of the second dielectric isolation structures (42, 44) may comprise a vertical stack of a silicon oxide rail 42 and a silicon nitride rail 44.

First dielectric gate spacers 46 may be formed on sidewalls of the second dielectric isolation structures (42, 44) by conformally depositing and anisotropically etching a first dielectric spacer material. Second dielectric gate spacers 48 may be formed on the first dielectric gate spacers 46 by conformally depositing and anisotropically etching a second dielectric spacer material.

The gate dielectric layers 30 may be formed by thermal oxidation of physically exposed portions of the semiconductor fins 12. Gate electrodes 56 may be formed between neighboring pairs of second dielectric isolation structures (42, 44) by depositing and recessing at least one gate electrode material, which may comprise a conductive gate electrode barrier material and a conductive gate electrode fill material. In this embodiment, each of the gate electrodes 56 may comprise a respective gate electrode liner 56A including the conductive gate electrode barrier material and a respective gate electrode fill material portion 56B including the conductive gate electrode fill material.

The silicon layer 60 may be subsequently deposited over the second dielectric isolation structures (42, 44), the first dielectric gate spacers 46, the second dielectric gate spacers 48, and the gate electrodes 56. The silicon layer 60 may comprise, and/or may consist essentially of, polysilicon or amorphous silicon. The silicon layer 60 may be subsequently planarized to provide a planar top surface that overlies the top surfaces of the second dielectric isolation structures (42, 44). Discrete openings may be subsequently formed in the silicon layer 60 over areas of the gate electrodes 56, and an anisotropic etch process may be performed to cut portions of the gate electrodes 56 that underlie the openings in the silicon layer 60. Segments of top surfaces of the first dielectric isolation structures (22, 24) may be physically exposed underneath openings through the silicon layer 60 and underneath volumes from which portions of the gate electrodes 56 are removed. A dielectric etch mask material such as silicon nitride may be formed over the top surface of the silicon layer 60, in the openings through the silicon layer 60, and in volumes from which portions of the gate electrodes 56 are removed to form a dielectric mask layer 62. The dielectric mask layer 62 comprises dielectric pillar portions 62P that fill the discrete openings in the silicon layer 60 and the volumes from which portions of the gate electrodes 56 are removed.

Figure 2A:
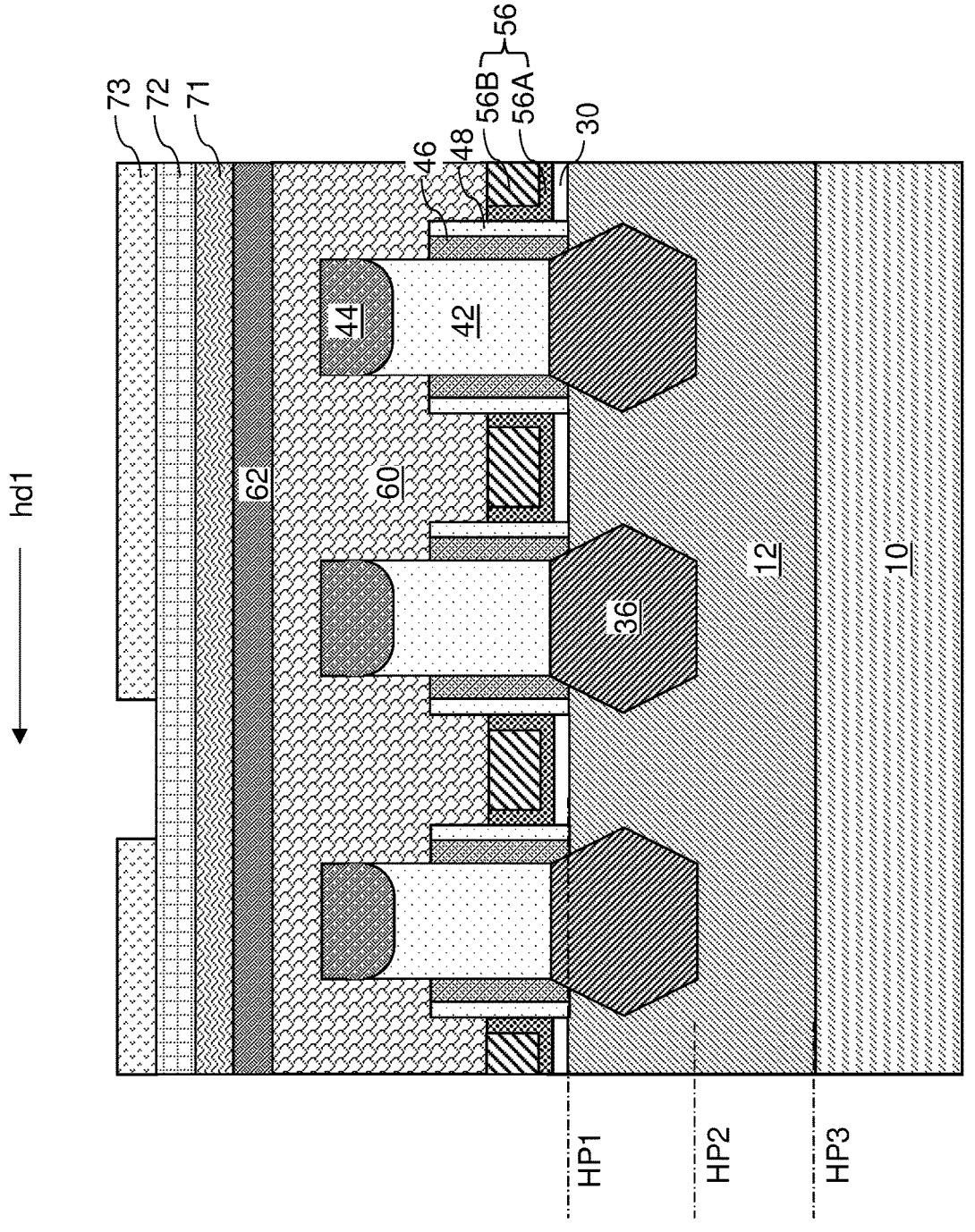
FIG. 2A is a first vertical cross-sectional view of the intermediate structure after formation of a lithographic layer stack and patterning of a photoresist layer along a vertical plane that is parallel to the first horizontal direction according to an embodiment of the present disclosure.
Figure 2B:
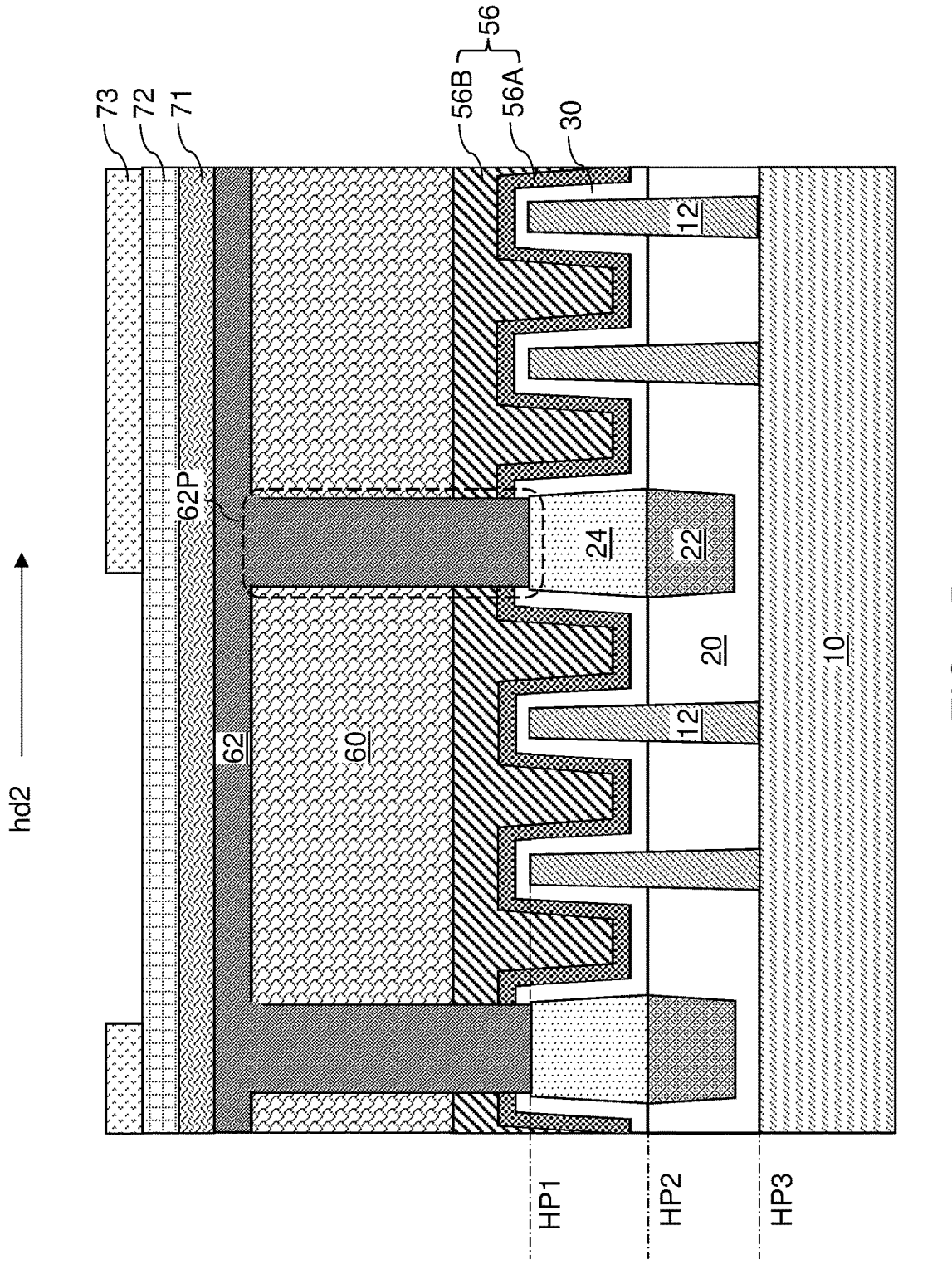
FIG. 2B is a second vertical cross-sectional view of the intermediate structure of FIG. 2A along a vertical plane that is parallel to the second horizontal direction that is perpendicular to the first horizontal direction.
Figure 2C:
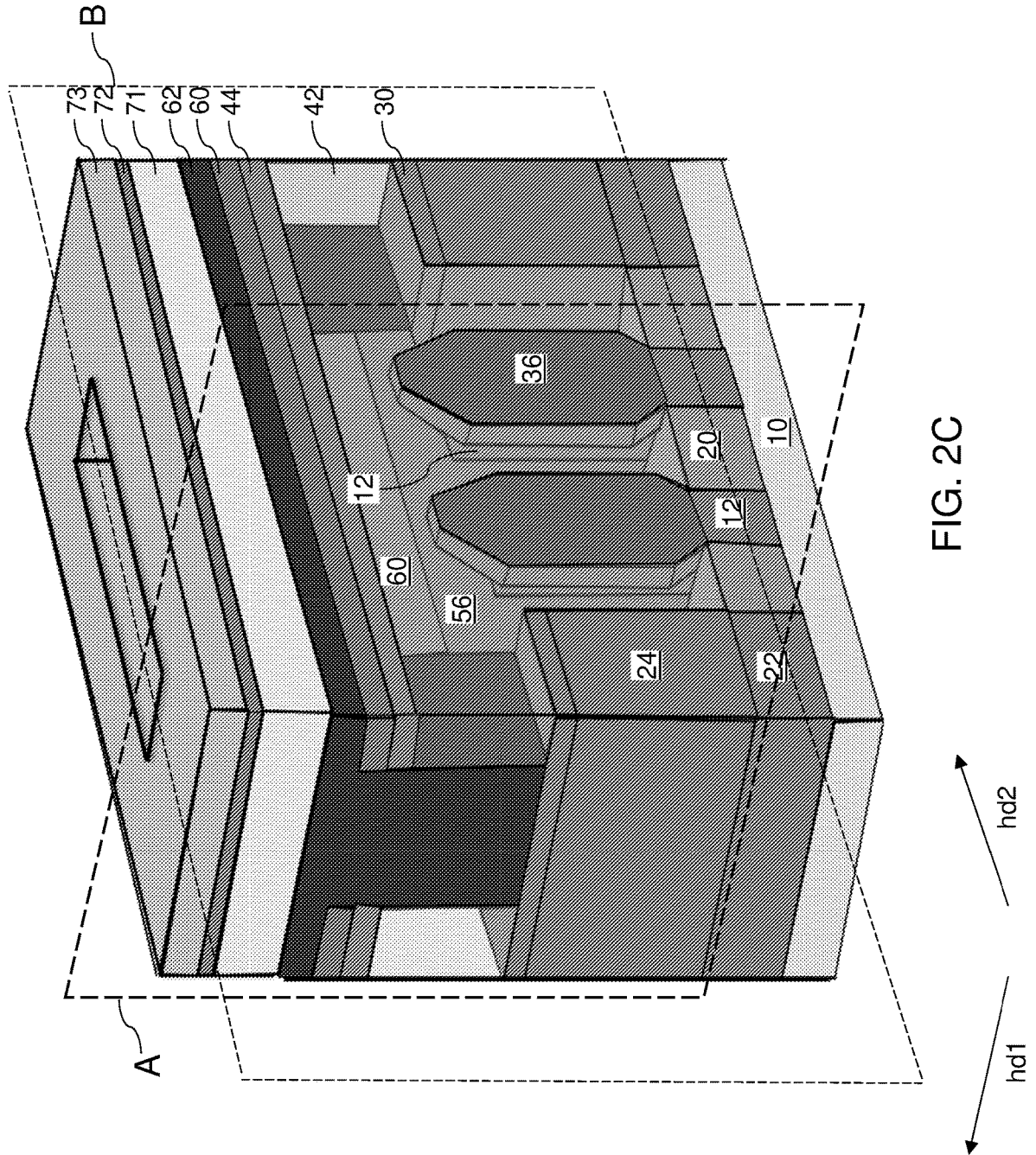
FIG. 2C is a perspective view of a box-shaped region of the intermediate structure of FIGS. 2A and 2B. The vertical plane A is the cut plane of the first vertical cross-sectional view of FIG. 2A. The vertical plane B is the cut plane of the second vertical cross-sectional plane of FIG. 2B.

Referring to FIGS. 2A-2C, a lithographic layer stack (71, 72, 73) may be formed over the top surface of the dielectric mask layer 62. The lithographic layer stack (71, 72, 73) may include, for example, a bottom anti-reflective coating (BARC) layer 71, a pattern transfer assist layer 72, and a photoresist layer 73. According to an aspect of the present disclosure, discrete openings may be formed in the photoresist layer 73 by lithographic exposure and development. The discrete openings may be formed in areas from which underlying portions of the semiconductor fins 12 are to be subsequently removed, i.e., to be subsequently cut by performing an anisotropic etch process.

Generally speaking, various design layouts for the fin field effect transistors of a semiconductor die may implement cuts in the semiconductor fins 12 at different cut densities. In other words, the ratio of the area of discrete openings to the total local area may be different from local area to local area. As used herein, a local area refers to an area having lateral dimensions of about 5-20 times the pitch of the semiconductor fins 12 along the first horizontal direction hd1 and along the second horizontal direction hd2.

Figure 3A:
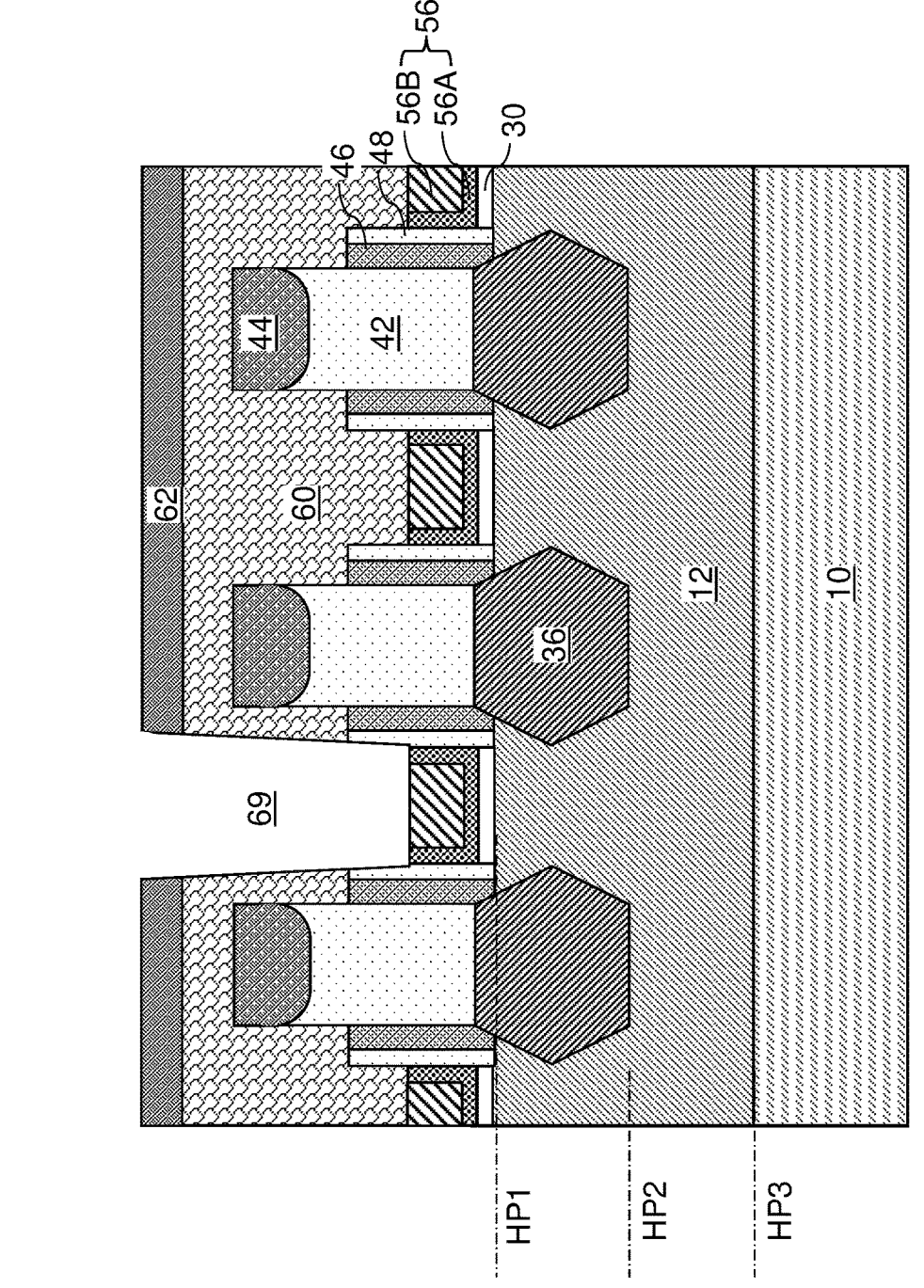
FIG. 3A is a first vertical cross-sectional view of the intermediate structure after formation of a via cavity by etching a portion of the silicon layer in a first anisotropic etch process along a vertical plane that is parallel to the first horizontal direction according to an embodiment of the present disclosure.
Figure 3B:
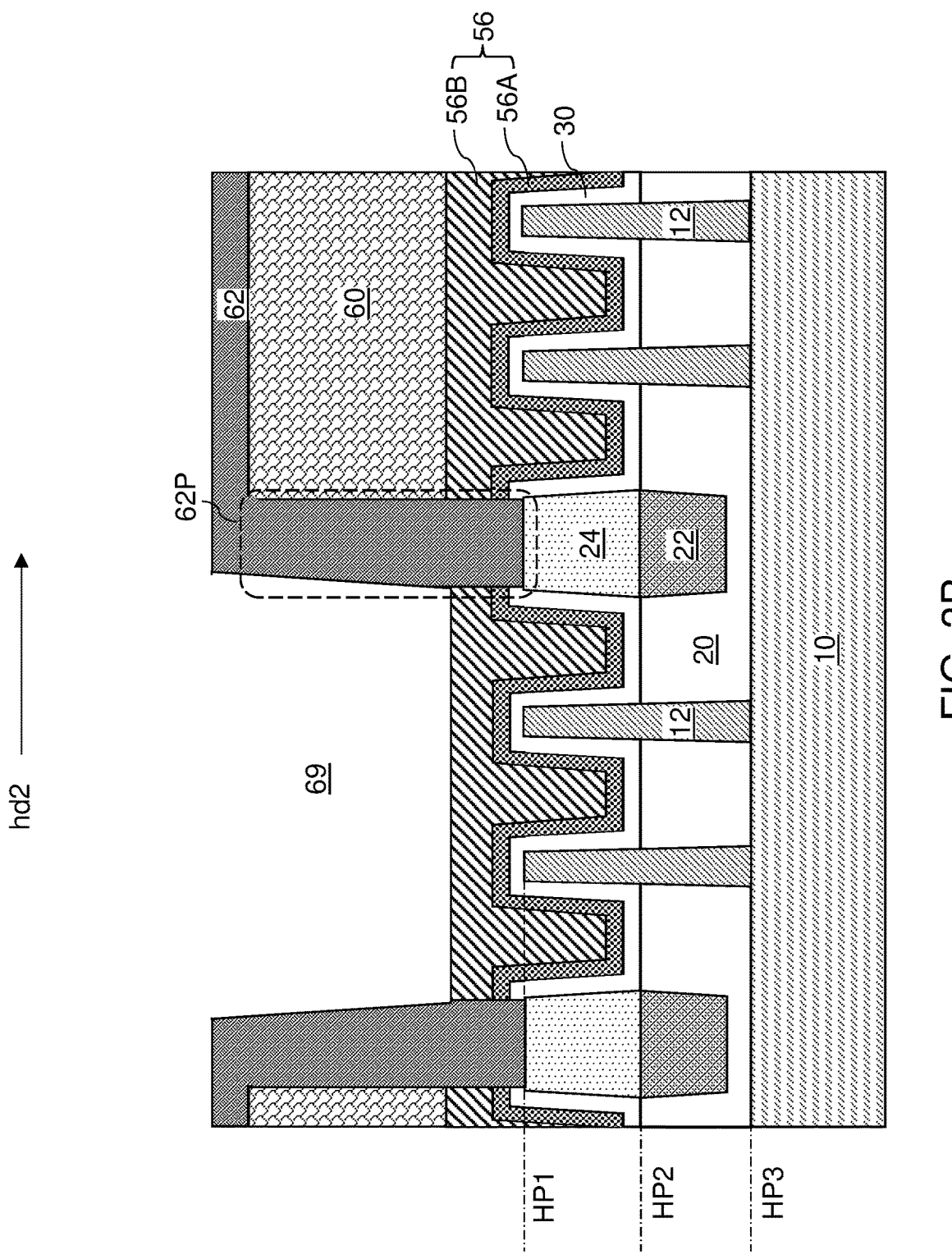
FIG. 3B is a second vertical cross-sectional view of the intermediate structure of FIG. 3A along a vertical plane that is parallel to the second horizontal direction that is perpendicular to the first horizontal direction.
Figure 3C:
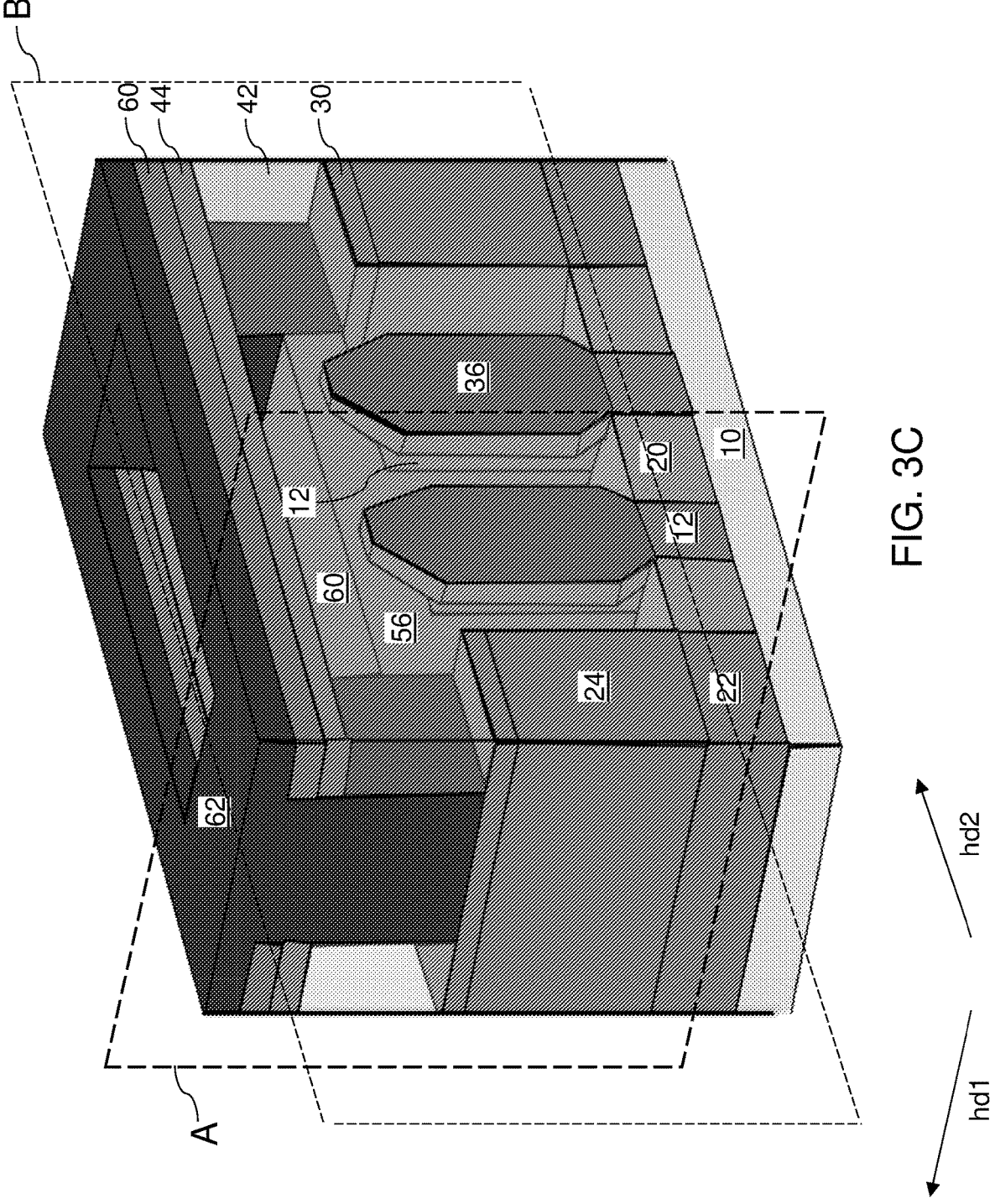
FIG. 3C is a perspective view of a box-shaped region of the intermediate structure of FIGS. 3A and 3B. The vertical plane A is the cut plane of the first vertical cross-sectional view of FIG. 3A. The vertical plane B is the cut plane of the second vertical cross-sectional plane of FIG. 3B.

Referring to FIGS. 3A-3C, an anisotropic etch process may be performed to transfer the pattern of the openings in the photoresist layer 73 into the pattern transfer assist layer 72, the BARC layer 71, and the dielectric mask layer 62. The photoresist layer 73, the pattern transfer assist layer 71, and the BARC layer 71 may be subsequently removed, for example, by performing an ashing process and additional wet etch processes. In one embodiment, removal of the photoresist layer 73 may eliminate a source for polymer generation in subsequent anisotropic etch processes from the exemplary structure.

According to an aspect of the present disclosure, a first anisotropic etch process may be performed to etch unmasked portions of the silicon layer 60 underneath the discrete openings in the dielectric mask layer 62. In one embodiment, the first anisotropic etch process may comprise a reactive ion etch process using a plasma of a gas that etches polysilicon.

For example, the first anisotropic etch process may comprise a reactive ion etch process using an etchant gas such as HBr, $BCl_3$, $Cl_2$, or $CF_4$, and optionally at least one additional gas that may improve process performance and control. The at least one additional gas may be flowed into an etch chamber simultaneously with the etchant gas. The at least one additional gas may include argon, oxygen, fluorine, nitrogen, and/or helium. In an illustrative example, the first anisotropic etch process may use a process gas or a combination of process gases including $HBr/Cl_2/O_2$, $HBr/CF4/O_2$, $Cl_2/O_2$. The first anisotropic etch process may have an etch chemistry that is selective to the material of the dielectric mask layer 62, the metallic material of the gate electrodes 56 and selective to the dielectric materials of the second dielectric gate spacers 48 and the first dielectric gate spacers 46.

A via cavity 69 may be formed in each volume from which portions of the silicon layer 60 are removed. According to an aspect of the present disclosure, edges of the openings in the dielectric mask layer 62 that laterally extend along the first horizontal direction hd1 may be formed at, or in proximity to, vertical planes of a pair of dielectric pillar portions 62P that face each other. In this embodiment, a via cavity 69 may be laterally bounded by two sidewalls of dielectric pillar portions 62P that are laterally spaced apart from each other along the second horizontal direction hd2.

Generally, a dielectric mask layer 62 including openings may be formed over the silicon layer 60, the first anisotropic etch process may be performed to etch portions of the silicon layer 60 that underlie the openings in the dielectric mask layer 62. A top surface of a gate electrode 56 may be physically exposed above each via cavity 69. A pair of sidewalls of two dielectric pillar portions 62P may be exposed around one, a plurality, and/or each, of the via cavities 69 to provide a configuration in which one, a plurality, and/or each, of the via cavities 69 is laterally bounded by a respective pair of sidewalls of dielectric pillar portions 62P along the second horizontal direction hd2. One, a plurality, and/or each, of the via cavities 69 may be laterally bounded along the first horizontal direction hd1 by a respective pair of sidewalls of the silicon layer 60 that laterally extend along the second horizontal direction hd2.

Figure 4A:
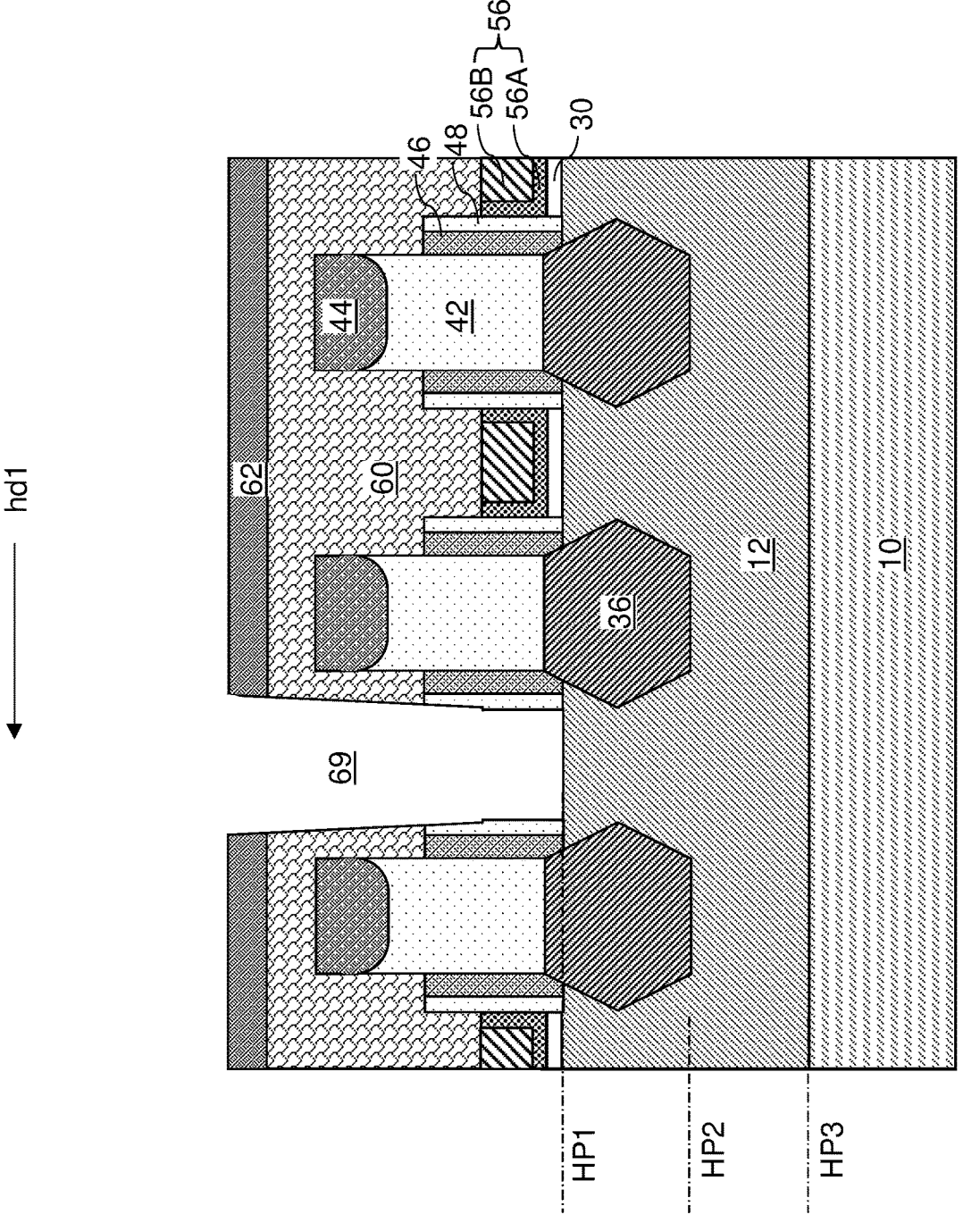
FIG. 4A is a first vertical cross-sectional view of the intermediate structure after vertically extending the via cavity by etching a portion of a gate electrode in a second anisotropic etch process along a vertical plane that is parallel to the first horizontal direction according to an embodiment of the present disclosure.
Figure 4B:
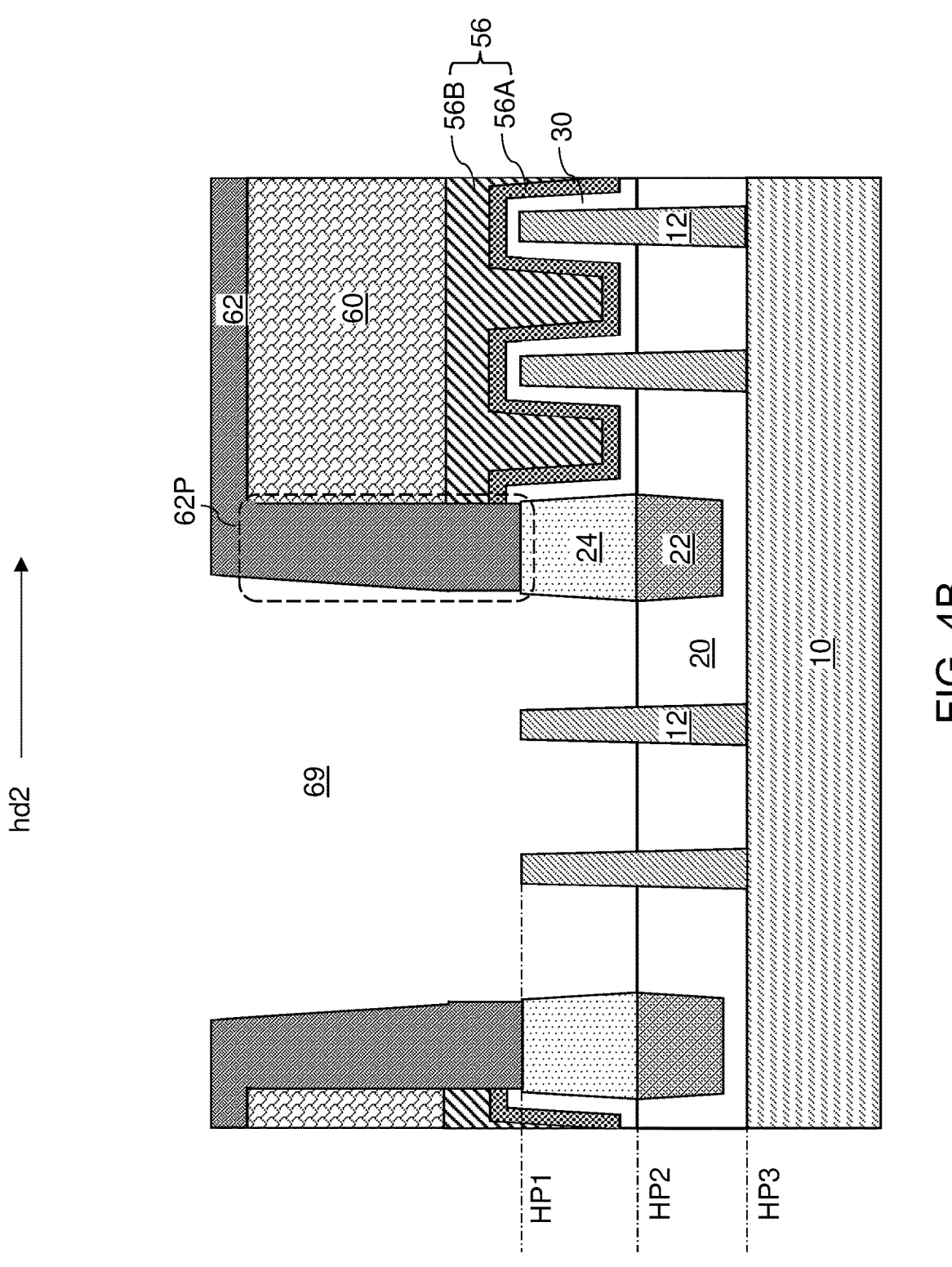
FIG. 4B is a second vertical cross-sectional view of the intermediate structure of FIG. 4A along a vertical plane that is parallel to the second horizontal direction that is perpendicular to the first horizontal direction.
Figure 4C:
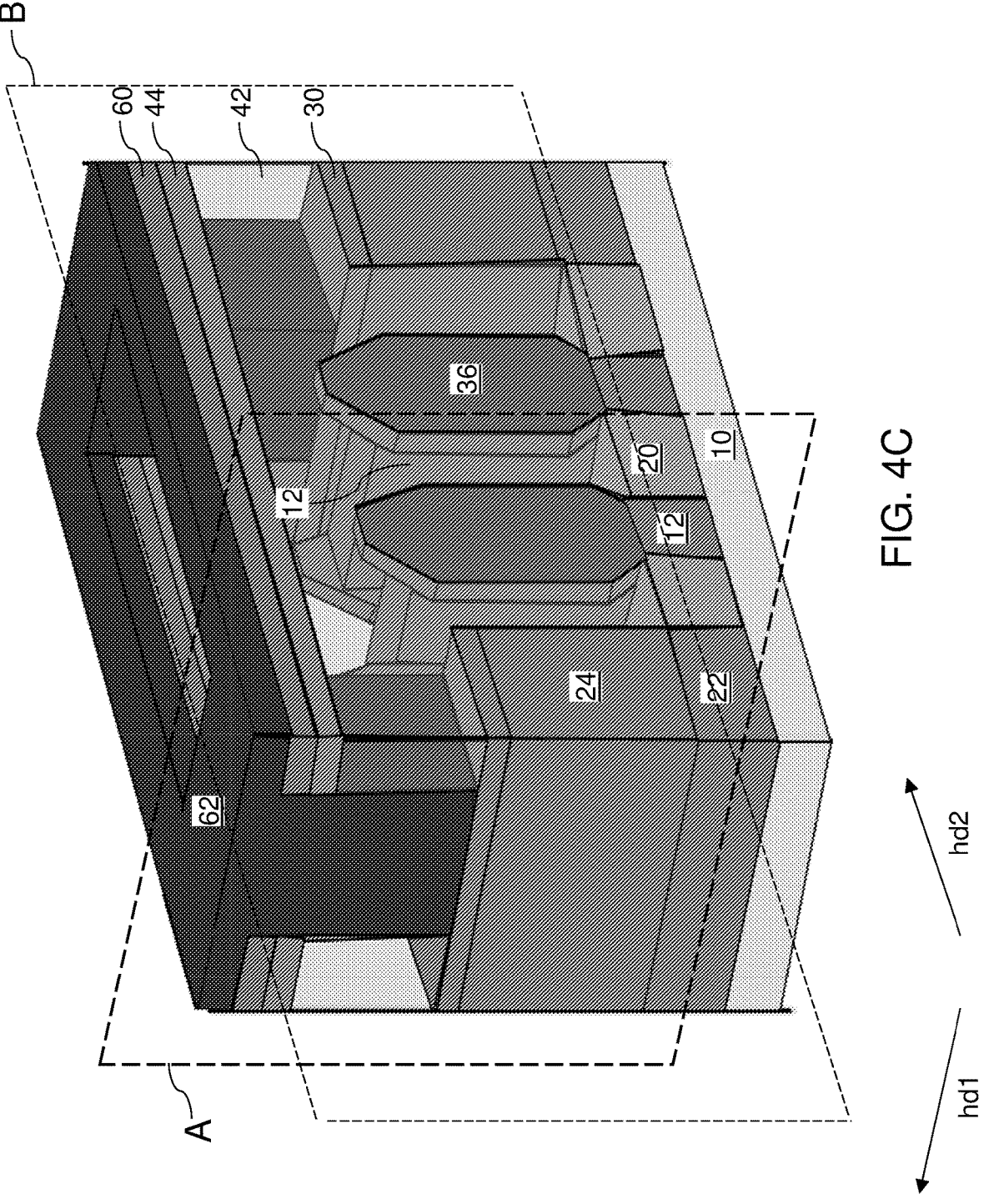
FIG. 4C is a perspective view of a box-shaped region of the intermediate structure of FIGS. 4A and 4B. The vertical plane A is the cut plane of the first vertical cross-sectional view of FIG. 4A. The vertical plane B is the cut plane of the second vertical cross-sectional plane of FIG. 4B.

Referring to FIGS. 4A-4C, a second anisotropic etch process (such as a reactive ion etch process) or an isotropic etch process (such as a wet etch process) may perform to selectively etch that metallic materials of the gate electrodes 56 with respect to the materials of the dielectric mask layer 62 and the dielectric material of the gate dielectric layers 30. The gate electrodes 56 may comprise a metallic gate electrode material such as titanium, cobalt, nickel, and/or aluminum, and may optionally include a conductive metallic barrier material such as titanium nitride, tantalum nitride, or tungsten nitride. The second anisotropic etch process may comprise a reactive ion etch process using a chlorine-containing gas (such as $Cl_2$ or $BCl_3$, etc.) and optionally oxygen and/or a fluorine-containing gas. The etch chemistry of the second anisotropic etch process may be selected based on the material composition of the gate electrodes 56. Moreover, the etch of metal gate stack may also be achieved by performing an isotropic wet etch process such as a wet etch process using a piranha solution.

Generally, the second anisotropic etch process or the isotropic etch process may etch portions of the gate electrode 56 that underlie the via cavities 69 as formed at the processing steps of FIGS. 3A-3C, and vertically extends the via cavities 69 through the gate electrodes 56. Thus, the second anisotropic etch process or the isotropic etch process etches portions of the gate electrodes 56 that underlie the openings in the dielectric mask layer 62. A gate electrodes 56 may be cut into multiple gate electrodes 56 upon vertical extension of the via cavities 69 by the second anisotropic etch process. The via cavities 69 may be formed by etching portions of the silicon layer 60 and the gate electrodes 56 that underlie the openings through the dielectric mask layer 62, and sidewalls of a respective pair of dielectric pillar portions 62P may be physically exposed to one, a plurality, and/or each of the via cavities 69. A gate dielectric layer 30 may be physically exposed at the bottom of each via cavity 69.

An etch process may be performed to etch physically exposed portions of the gate dielectric layers 30. The etch process may comprise an anisotropic etch process or an isotropic etch process. In embodiments in which an anisotropic etch process is used, a halogen based etchant (such as $CF_4$, $CHF_3$, $Cl_2$, $BCl_3$) may be used to etch the physically exposed portions of the gate dielectric layers 30. In a non-limiting illustrative example, the anisotropic etch process may comprise a reactive ion etch process using $CF_4/O_2$, $CF_4/CHF_3/Ar$, $C_4F_8/O_2$, or $CH_2F_2$. In embodiments in which an isotropic etch process is used, a wet etch process using piranha solution may be performed to etch physically exposed portions of the gate dielectric layers 30. Surfaces of the semiconductor fins 12 may be physically exposed after removing physically exposed portions of the gate dielectric layers 30.

Figure 5A:
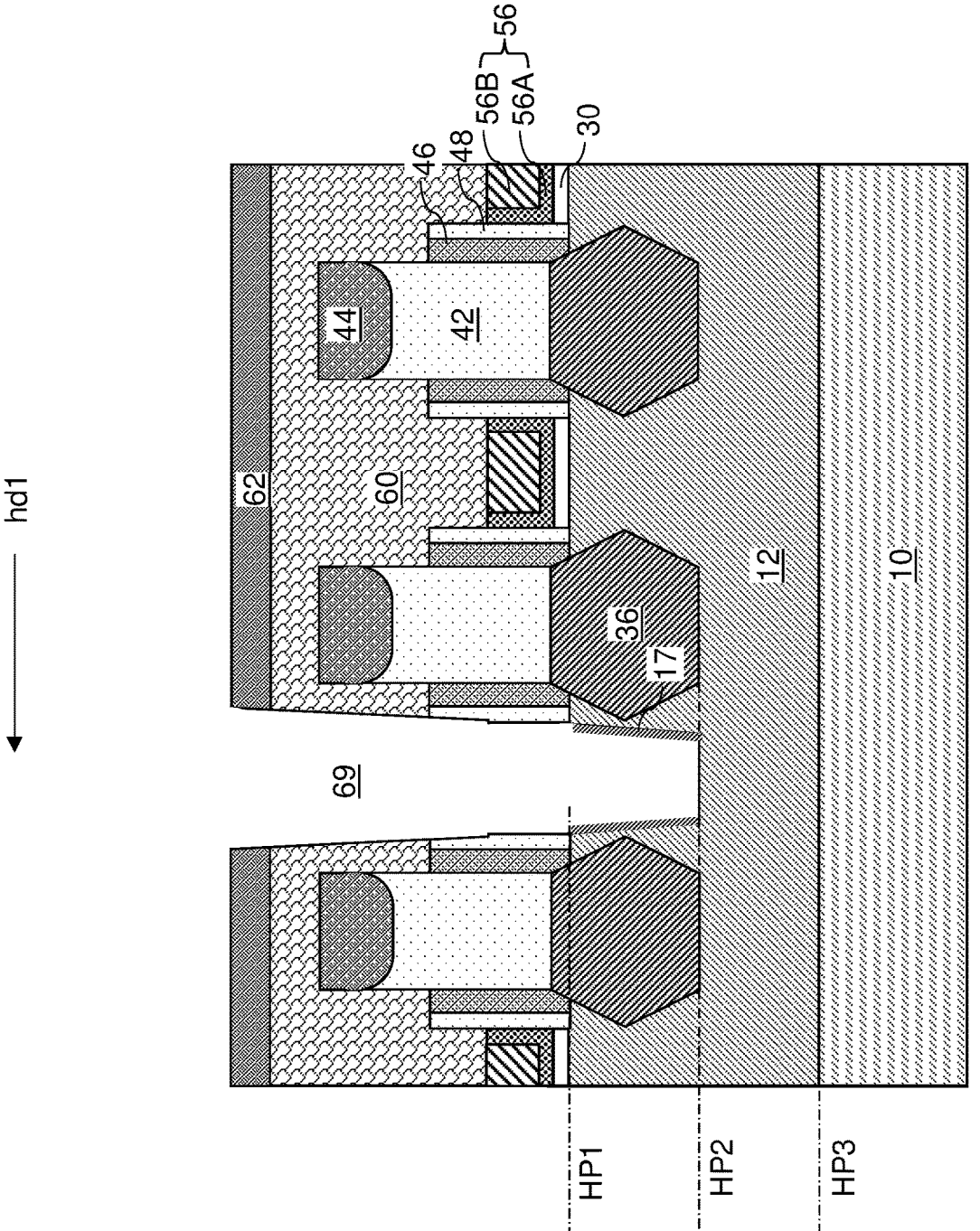
FIG. 5A is a first vertical cross-sectional view of the intermediate structure after a first step of a third anisotropic etch process along a vertical plane that is parallel to the first horizontal direction according to an embodiment of the present disclosure.
Figure 5B:
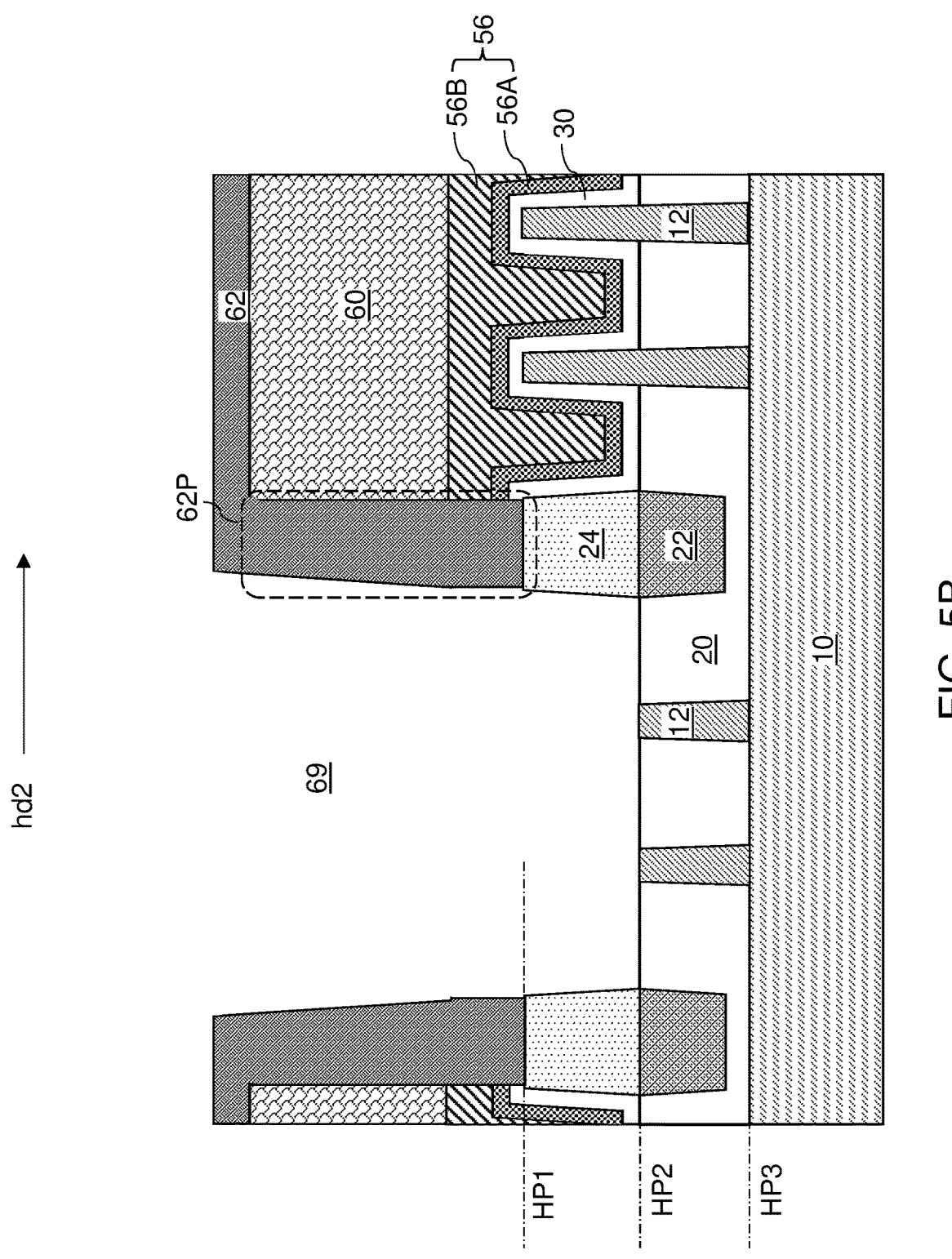
FIG. 5B is a second vertical cross-sectional view of the intermediate structure of FIG. 5A along a vertical plane that is parallel to the second horizontal direction that is perpendicular to the first horizontal direction.
Figure 6A:
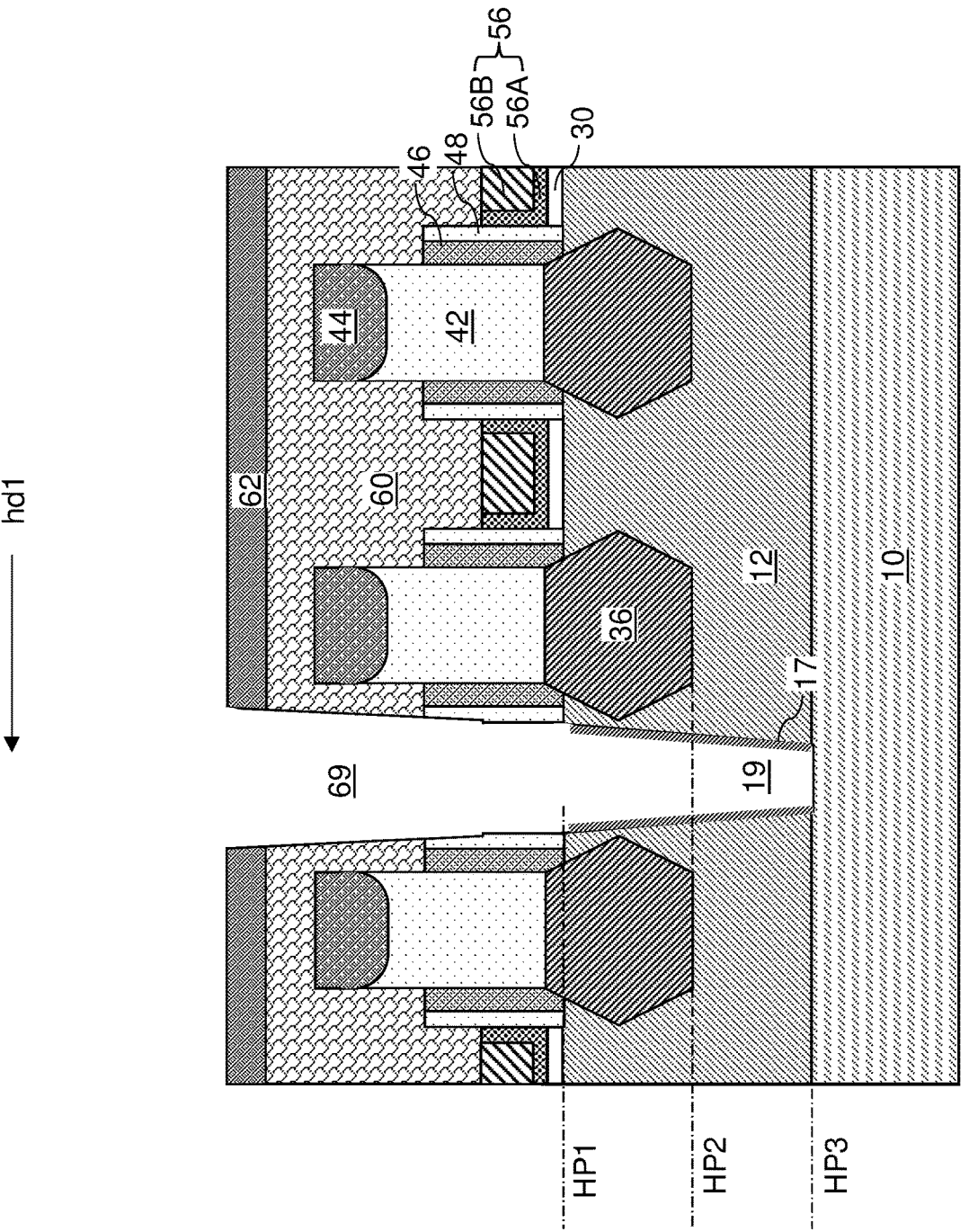
FIG. 6A is a first vertical cross-sectional view of the intermediate structure after a second step of the third anisotropic etch process along a vertical plane that is parallel to the first horizontal direction according to an embodiment of the present disclosure.
Figure 6B:
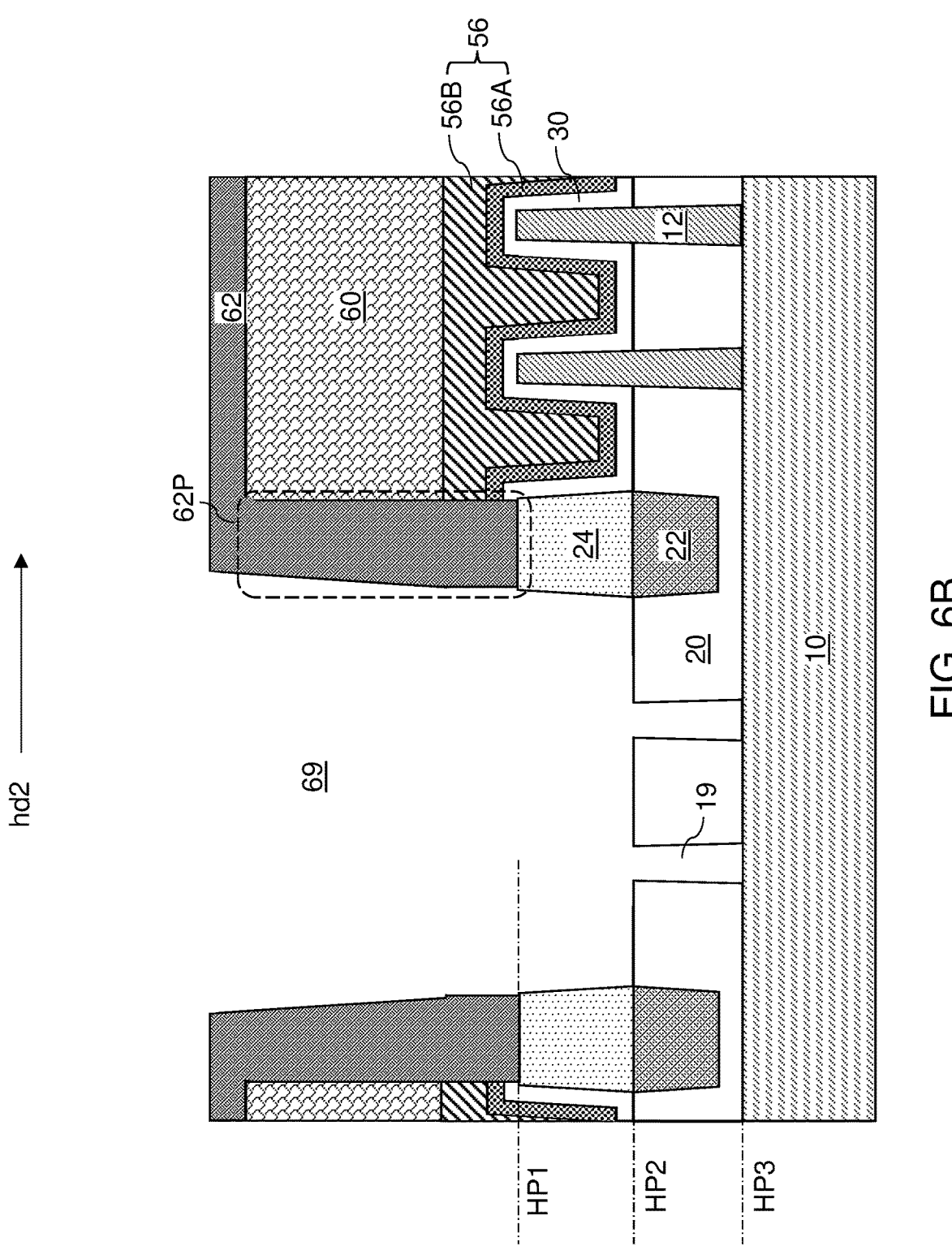
FIG. 6B is a second vertical cross-sectional view of the intermediate structure of FIG. 6A along a vertical plane that is parallel to the second horizontal direction that is perpendicular to the first horizontal direction.
Figure 7A:
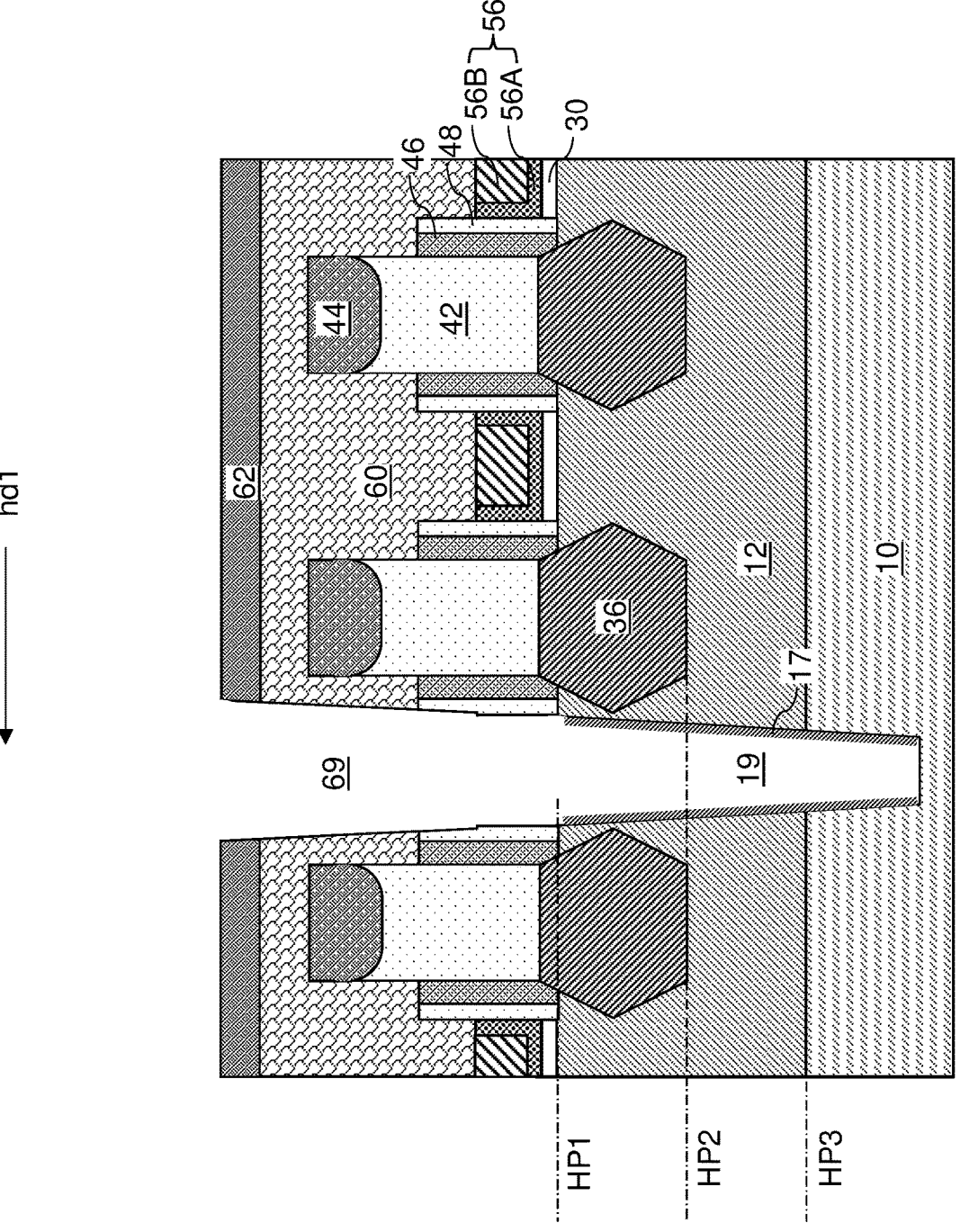
FIG. 7A is a first vertical cross-sectional view of the intermediate structure after a third step of the third anisotropic etch process along a vertical plane that is parallel to the first horizontal direction according to an embodiment of the present disclosure.
Figure 7B:
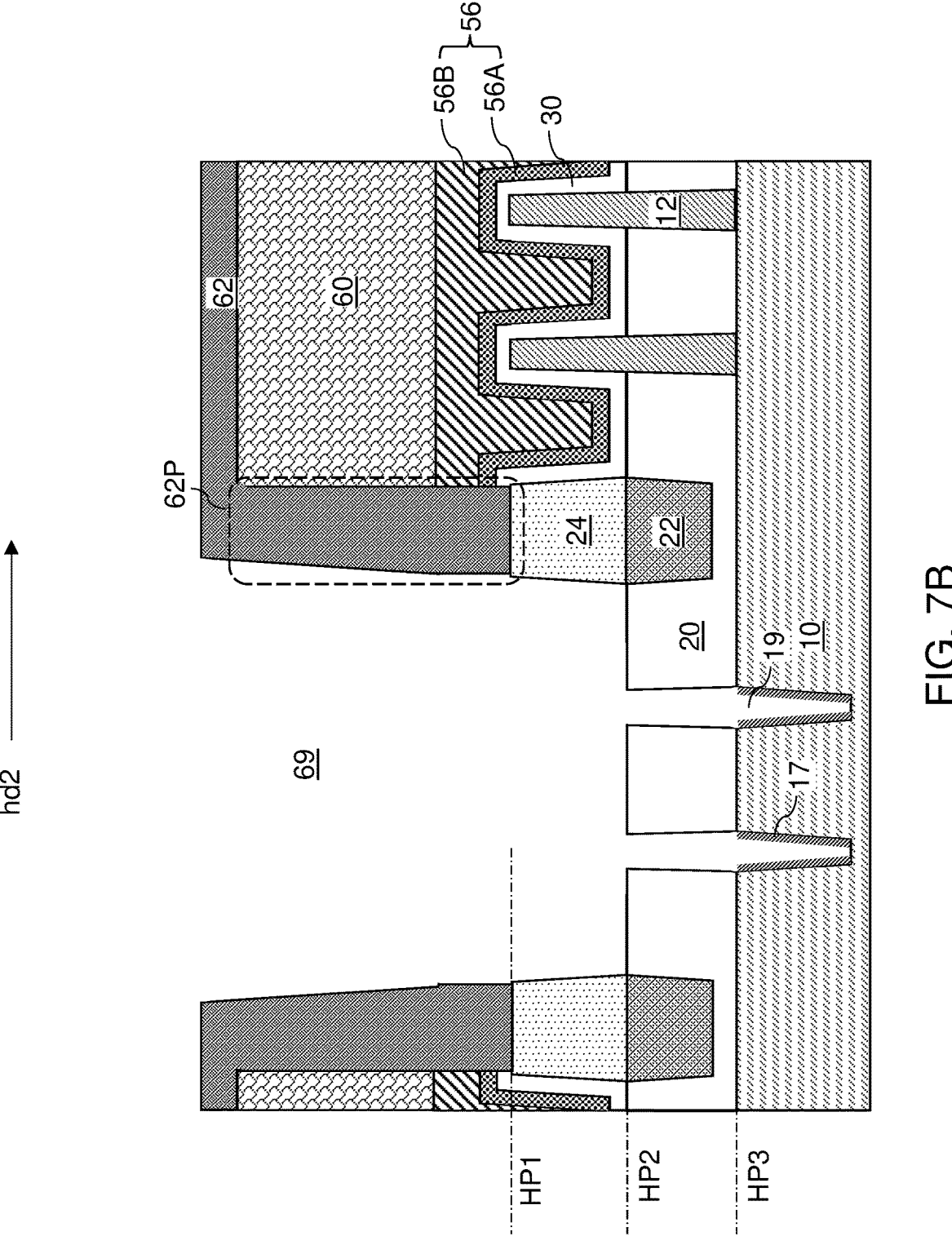
FIG. 7B is a second vertical cross-sectional view of the intermediate structure of FIG. 7A along a vertical plane that is parallel to the second horizontal direction that is perpendicular to the first horizontal direction.

Referring collectively to FIGS. 5A and 5B, 6A and 6B, and 7A and 7B, a third anisotropic etch process may be performed to cut unmasked portions of semiconductor fins 12 that underlie the via cavities 69 and to form trenches 19 in the semiconductor substrate 10 eventually. Generally, the third anisotropic etch process may be performed in steps. These steps may include: a first anisotropic etch step during which first portions of the semiconductor fins 12 that underlie the first horizontal plane HP1 and overlie a second horizontal plane HP2 including the top surface of the shallow trench isolation structure 20 are removed; a second anisotropic etch step during which second portions of the semiconductor fins 12 that underlie the second horizontal plane HP2 and overlie a third horizontal plane HP3 including a top surface of the semiconductor substrate 10 are removed; and a third anisotropic etch step during which the portions of the semiconductor substrate 10 underlying the third horizontal plane HP3 are removed. FIGS. 5A and 5B illustrate the exemplary structure after the first anisotropic etch step; FIGS. 6A and 6B illustrate the exemplary structure after the second anisotropic etch step; and FIGS. 7A-7B illustrate the exemplary structure after the third anisotropic etch step.

The third anisotropic etch process etches portions of the semiconductor fins 12 that are not covered by the combination of the silicon layer 60 and the dielectric mask layer 62, and etches portions of the semiconductor substrate 10 that underlie the via cavity 69 and not covered by the shallow trench isolation structure 20. Generally, the third anisotropic etch process etches the material of the semiconductor fins 12 and the material of the semiconductor substrate 10 selective to the material of the shallow trench isolation structure 20.

According to an aspect of the present disclosure, each anisotropic etch step within the third anisotropic etch process may use a plasma of a respective gas mixture comprising hydrogen bromide gas. Each anisotropic etch step within the third anisotropic etch process may comprise a reactive ion etch process in which hydrogen bromide (HBr) gas is used in combination with one or more other gases for improving process performance and control. Gases that may be flowed into the etch chamber simultaneously with the hydrogen bromide gas include, but are not limited to, argon, and/or helium. Argon may be used as a carrier gas to help transport other gases into the etch chamber, and increase physical etching for the etching process. Argon may also be used to control the plasma density and uniformity. Oxygen may be used to improve the profile control by forming SiBrO passivation layers during etching the silicon material of the semiconductor fins 12 and the semiconductor substrate 10, and to remove any organic contamination from the physically exposed silicon surfaces. Generally, higher oxygen flow will lead to the formation of thicker passivation layers, enabling better capability to conserve the critical dimension of the profile. Helium may be used to help control the pressure in the etch chamber and to improve the heat conductivity.

Table 1 below illustrates non-limiting examples of gas flow parameters for the third anisotropic etch process of the present disclosure. The unit sccm stands for standard cubit centimeters per minute.

TABLE 1

| Gas flow parameters for the third anisotropic etch process | | | | |
|---|---|---|---|---|
| Process No. | HBr (sccm) | Ar (sccm) | $O_2$ (sccm) | He (sccm) |
| Process 1 | 150-500 | 100-400 | 5-50 | 0-100 |
| Process 2 | 150-500 | 100-400 | 5-50 | 0-100 |
| Process 3 | 150-500 | 100-400 | 5-20 | 0-100 |

In one embodiment, the ratio of the flow rate of the oxygen gas to the flow rate of the hydrogen bromide gas may be in a range from 0 to 0.3. In one embodiment, the oxygen gas may have a partial pressure in a range from 0.1 mTorr to 15 mTorr, such as from 0.5 mTorr to 5 mTorr, during the third anisotropic etch step of the third anisotropic etch process. The process parameters of the third anisotropic etch process may be selected to provide a uniform etch rate that is independent of local pattern factor for the areas of physically exposed surfaces of the semiconductor fins 12.

According to an aspect of the present disclosure, the process parameters of the three anisotropic etch steps of the third anisotropic etch process may be selected such that each of the three anisotropic etch steps is optimized for etching different portions of the semiconductor fins 12 and the semiconductor substrate 10. Specifically, the first anisotropic etch step may be optimized for striking a plasma and for providing a high etch rate for the upper portions of the semiconductor fins 12, of which sidewalls laterally extending along the second horizontal direction hd2 are physically exposed during the first anisotropic etch step. Lower $O_2$ flow and higher pressure may be used to reduce the formation of passivation layer to increasing the Si etch rate and enhance the chemical etch of Si, respectively.

To avoid critical dimension (CD) broadening (i.e., to keep the lateral dimension of the patterned structure small), the second anisotropic etch step may use a higher ratio of the oxygen flow rate to the hydrogen bromide flow rate relative to the first anisotropic etch step, and the total pressure in the etch chamber during the second anisotropic etch step may be lower than the total pressure of the first anisotropic etch step to ensure the directionality of the etchant.

In one embodiment, the third anisotropic etch step may use a higher ratio of the oxygen flow rate to the hydrogen bromide flow rate relative to the first anisotropic etch step to better avoid CD broadening. Moreover, the total pressure in the etch chamber during the third anisotropic etch step may be lower than the total pressure of the first anisotropic etch step, and may be lower than the total pressure of the second anisotropic etch step, to enhance the directionality of the plasma to conserve CD. Generally speaking, the third anisotropic etch step comprises at least one low pressure etch step (e.g., the first anisotropic etch step, the second anisotropic etch step and/or the third anisotropic etch step). In one embodiment, the at least one low pressure etch step may comprise at least the third anisotropic etch step, and may optionally include the second anisotropic etch step. In this embodiment, the first anisotropic etch step may be performed at a total pressure that is higher than the total pressure of the third anisotropic etch step.

For example, the first anisotropic etch step may be performed at a first total pressure in a range from 50 mTorr to 100 mTorr; the second anisotropic etch step may be performed at a second total pressure in a range from 30 mTorr to 50 mTorr; and the third anisotropic etch step may be performed at a third total pressure in a range from 5 mTorr to 50 mTorr, such as from 5 mTorr to 30 mTorr, and/or from 5 mTorr to 20 mTorr. In one embodiment, the first total pressure may be greater than 60 mTorr, and/or 70 mTorr, and/or 80 mTorr, and/or 90 mTorr, and/or 100 mTorr, and/or 120 mTorr. The first total pressure may be less than 120 mTorr, and/or 100 mTorr, and/or 90 mTorr, and/or 80 mTorr. Further, the second total pressure may be greater than 30 mTorr, and/or 40 mTorr, and/or 45 mTorr, and/or 50 mTorr, and/or 60 mTorr, and/or 70 mTorr, and/or 80 mTorr. The second total pressure may be less than 100 mTorr, and/or 90 mTorr, and/or 80 mTorr, and/or 70 mTorr, and/or 60 mTorr, and/or 50 mTorr, and/or 40 mTorr. The third total pressure may be greater than 5 mTorr, and/or 7.5 mTorr, and/or 10 mTorr, and/or 15 mTorr, and/or 20 mTorr, and/or 25 mTorr, and/or 30 mTorr, and/or 40 mTorr. The third total pressure may be less than 50 mTorr, and/or 40 mTorr, and/or 30 mTorr, and/or 25 mTorr, and/or 20 mTorr, and/or 15 mTorr, and/or 10 mTorr.

In one embodiment, the total pressure may be below 30 mTorr, such as less than 5 mTorr, between each steps in the third anisotropic etch process. In one embodiment, a conformal silicon oxide liner deposition process and a silicon oxide etch back process may be performed between the second anisotropic etch step and the third anisotropic etch step to improve process uniformity. In this embodiment, a combination of $SiCl_4$ and $O_2$ may be used to deposit the conformal silicon oxide liner, and an anisotropic etch process employing $CF_4$ or $CHF_3$ may be used for the silicon oxide etch bask process.

According to an embodiment of the present disclosure, the third anisotropic etch process of the present disclosure uses a low-total-pressure condition at least during etching of the silicon material of the semiconductor substrate 10, i.e., during formation of the trenches 19. Thus, the at least one low pressure etch step within the third anisotropic etch process comprises the third anisotropic etch step, and may optionally include the second anisotropic etch step. In other words, the third anisotropic etch step may be performed at the third total pressure in a range from 5 mTorr to 50 mTorr, and the second anisotropic etch step may, or may not, be performed at a total pressure in a range from 5 mTorr to 50 mTorr.

In one embodiment, during each of the at least one low pressure etch step, the gas mixture comprises oxygen gas, and a ratio of a flow rate of the oxygen gas to a flow rate of the hydrogen bromide gas is in a range from 0 to 0.5. In one embodiment, the oxygen gas may have a partial pressure in a range from 0.1 mTorr to 10 mTorr during each of the at least one low pressure etch step.

In one embodiment, during the at least one low pressure etch step, the gas mixture comprises oxygen gas; trenches 19 are formed in the semiconductor substrate 10; and a flow rate of the oxygen gas is selected such that a continuous etch residue layer 17 is formed on sidewalls of the trenches 19.

Generally, a continuous etch residue layer 17 may be formed on physically exposed surfaces of the semiconductor fins 12 and the trenches 19 during each anisotropic etch step of the third anisotropic etch process, i.e., during the first anisotropic etch step that provides the intermediate structure illustrated in FIGS. 5A and 5B, during the second anisotropic etch step that provides the intermediate structure illustrated in FIGS. 6A and 6B, and during the third anisotropic etch step that provides the intermediate structure illustrated in FIGS. 7A and 7B. The material composition of the continuous etch residue layer 17 may change through the various anisotropic etch steps of the third anisotropic etch process. For example, the continuous etch residue layer 17 may comprise a large fraction of polymer residues during the first anisotropic etch step. According to an aspect of the present disclosure, the oxygen flow rate and the total pressure during the third anisotropic etch step may be selected such that a predominant fraction of the polymer residue volatilizes and the continuous etch residue layer 17 is composed primarily of a silicon oxide residue material, which is a non-volatile material.

In one embodiment, during each of the at least one low pressure etch step, the continuous etch residue layer 17 comprises a mixture of a polymer residue material and a silicon oxide residue material; and a molar fraction of the silicon oxide residue material within the continuous etch residue layer 17 may be in a range from 0.7 to 0.999. The polymer residue material comprises a silicon-bromine polymer in embodiments in which hydrogen bromide is used as an etchant gas. The silicon-bromide polymer may be effectively volatilized by reducing the total pressure in the each low pressure etch step. The continuous etch residue layer 17 may cover at least 80%, and/or 90%, and/or 96% of the underlying surface, and may have an average thickness in a range from 0.3 nm to 0.8 nm. Generally, the continuous etch residue layer 17 prevents lateral expansion of the bottom portion of the via cavities 69 and the trenches 19 that extend through the shallow trench isolation structure 20 and the semiconductor substrate 10, and prevents exposure of the epitaxial source/drain regions 36 to the via cavities 69.

In one embodiment, each of the at least one low pressure etch step simultaneously generates a polymer residue material and a silicon oxide residue material; the removal rate of the polymer residue material may be in a range from 80% to 100% of a generation rate of the polymer residue material; and the removal rate of the silicon oxide residue material is in a range from 1% to 50% of a generation rate of the silicon oxide residue material. Thus, the polymer residue material may be continuously removed through volatilization in the low pressure environment, and the silicon oxide residue material continuously accumulates on the sidewalls of the trenches 19 in the semiconductor substrate 10 and physically exposed sidewalls of the semiconductor fins 12 as cut during the first and second anisotropic etch steps.

Generally speaking, striking a plasma at a low total pressure condition, such as a total pressure less than 30 mTorr is difficult. Typically, an optimal range for a total pressure for striking a plasma is generally between 30 mTorr to 100 mTorr. According to an aspect of the present disclosure, electron cyclotron resonance (ECR) may be used to strike the plasma of the gas mixture at the first anisotropic etch step. Subsequently, the ECR may be continuously applied during transition of the first total pressure of the first anisotropic etch step to the second total pressure of the second anisotropic etch step between the first anisotropic etch step and the second anisotropic etch step. Further, the ECR may be continuously applied throughout the second anisotropic etch step and during transition of the second total pressure of the second anisotropic etch step to the third total pressure of the third anisotropic etch step between the second anisotropic etch step and the third anisotropic etch step.

Generally, the transition between the first total pressure and the second total pressure may occur at the end of the first anisotropic etch step and/or at the beginning of the second anisotropic etch step gradually such that the stability of the plasma is not disturbed. Further, the transition between the second total pressure and the third total pressure may occur at the end of the second anisotropic etch step and/or at the beginning of the third anisotropic etch step gradually such that the stability of the plasma is not disturbed. In one embodiment, the reduction in the total pressure between a uniform total pressure segment of the first anisotropic etch step (during which the total pressure of the etch chamber is at the first total pressure) and a uniform total pressure segment of the second anisotropic etch step (during which the total pressure of the etch chamber is at the second total pressure) may be effected by reduction in the flow rate of the various process gases and/or by an increase in the pumping speed of the vacuum pump attached to the etch chamber. In one embodiment, the reduction in the total pressure between a uniform total pressure segment of the second anisotropic etch step (during which the total pressure of the etch chamber is at the second total pressure) and a uniform total pressure segment of the third anisotropic etch step (during which the total pressure of the etch chamber is at the third total pressure) may be effected by reduction in the flow rate of the various process gases and/or by an increase in the pumping speed of the vacuum pump attached to the etch chamber.

According to an aspect of the present disclosure, the plasma of the first anisotropic etch step may be struck using electron cyclotron resonance (ECR). ECR uses a magnetic field to confine and sustain the plasma. The plasma is generated by the interaction between an radio frequency (RF) power source and the electrons in the plasma. The acceleration of electrons to high energies leads to the ionization of the gas molecules, thereby creating a plasma with high densities of ions. The ECR method may be effectively used to strike the plasma of the first anisotropic etch step at the first total pressure, which may be in a range of 5 mTorr to 150 mTorr.

The ECR method is advantageous over an inductively couple plasma (ICP) method for maintaining a plasma especially at a low total pressure, such as a total pressure in a range from 5 mTorr to 50 mTorr. In the ICP method, an RF source is used to inductively couple energy into the gas in the chamber for generation of a plasma. However, the electron temperature of an ICP plasma is typically lower compared to the electron temperature of an ECR plasma. According to an aspect of the present disclosure, the ICP method is used to strike a plasma at a pressure greater than 30 mTorr, and then the total pressure is reduced to a range from 5 mTorr to 50 mTorr while maintaining the plasma. This allows maintenance of a plasma with high ion density at a low pressures during the third anisotropic etch step and optionally during the second anisotropic etch step. Generally, the ICP method requires a higher pressure to strike a plasma than the ECR method. Thus, the plasma that is struck at the first anisotropic etch step may be maintained through the second anisotropic etch step and the third anisotropic etch step despite the reduction in the total pressure.

Figures 8A, 8B, 8C:
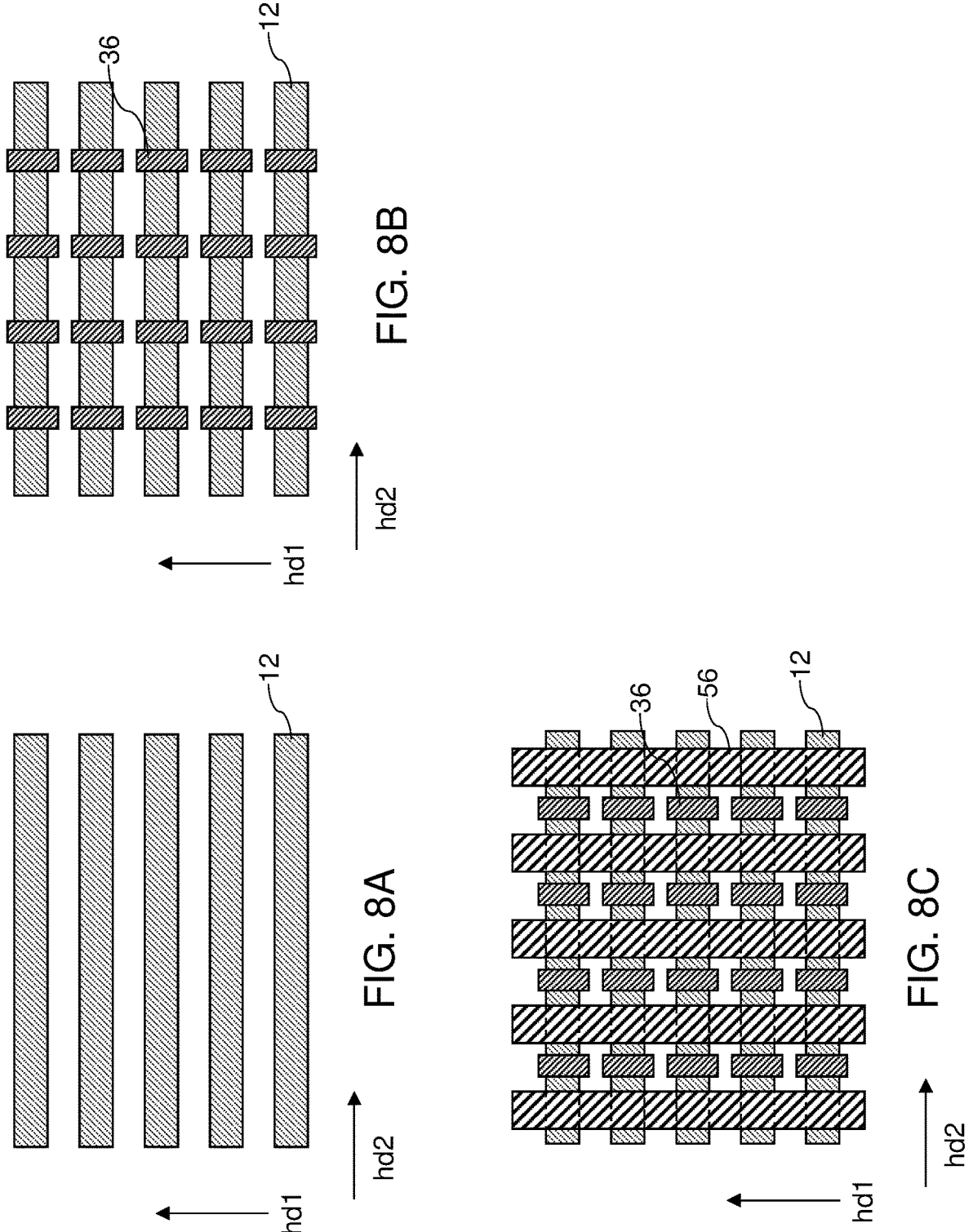
FIGS. 8A-8C are sequential schematic top-down views of a region of the exemplary structure during formation of semiconductor fins, epitaxial source-drain regions, and gate electrodes according to an embodiment of the present disclosure.

Referring to FIGS. 8A-8C, sequential schematic top-down views of a region of the exemplary structure are illustrated. The view of FIG. 8A corresponds to the processing step after formation of semiconductor fins 12, the view of FIG. 8B corresponds to the processing step after formation of the epitaxial source-drain regions 36, and the view of FIG. 8C corresponds to the processing steps after formation of gate electrodes 56. The semiconductor substrate 10, the shallow trench isolation structure 20, and additional structures are omitted for clarity.

Figures 9A, 9B, 9C, 9D:
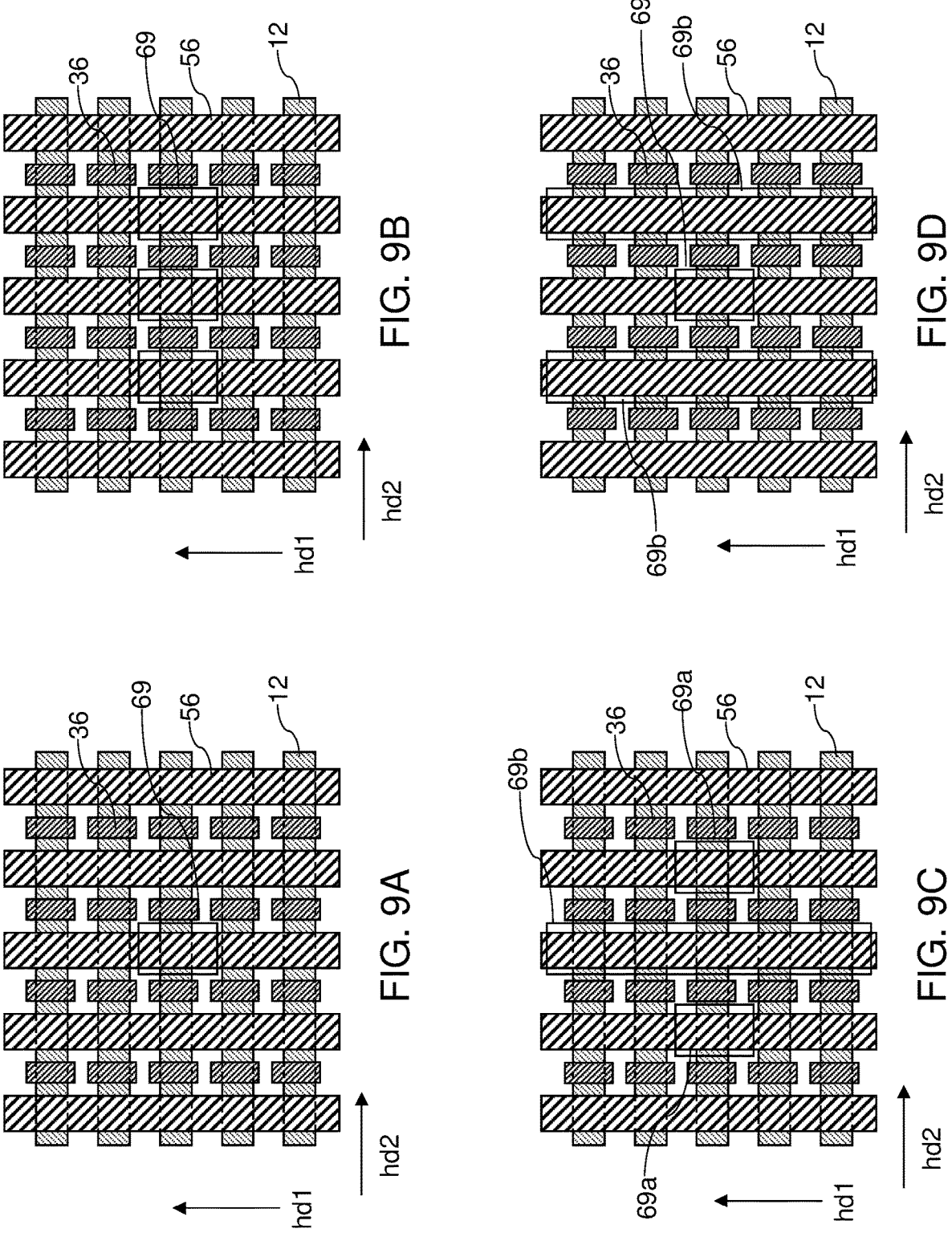
FIGS. 9A-9D are top-down views of various configurations of the exemplary structure after formation of via cavities according to an embodiment of the present disclosure.

FIGS. 9A-9D are top-down views of various configurations of the structure after formation of via cavities 69 according to an embodiment of the present disclosure. The pattern of the via cavities 69 is the same as the pattern of the openings in the dielectric mask layer 62, and is the same as the area of the cuts through the gate electrodes 56 and through the semiconductor fins 12. Generally, the pattern factor for the via cavities 69 may vary widely as illustrated in FIGS. 9A-9D. FIG. 9A illustrates a configuration having a single via cavity 69 of a small area in a top-down view, and thus, providing a very low pattern factor. FIG. 9B illustrates a configuration in which three small via cavities 69 that are adjacent to one another. FIG. 9C illustrates a configuration in which a large via cavity 69b is disposed between two small via cavities 69a. FIG. 9D illustrates a configuration in which a small via cavity 69a is disposed between two large via cavities 69b, and thus, providing a large pattern factor for the via cavities 69 (69a, 69b). According to an embodiment of the present disclosure, the at least one low pressure etch step of the third anisotropic etch process enhances the depth uniformity of the via cavities 69 within a wide range of pattern factors. Preliminary data on tested samples show that the depth distribution of the trenches has a standard deviation that is less than 2% of the average depth of the trenches 19 across all tested configurations that include a configuration of a single small via cavity 69a and a one-dimensional array of long (large) via cavities 69b.

Figure 10:
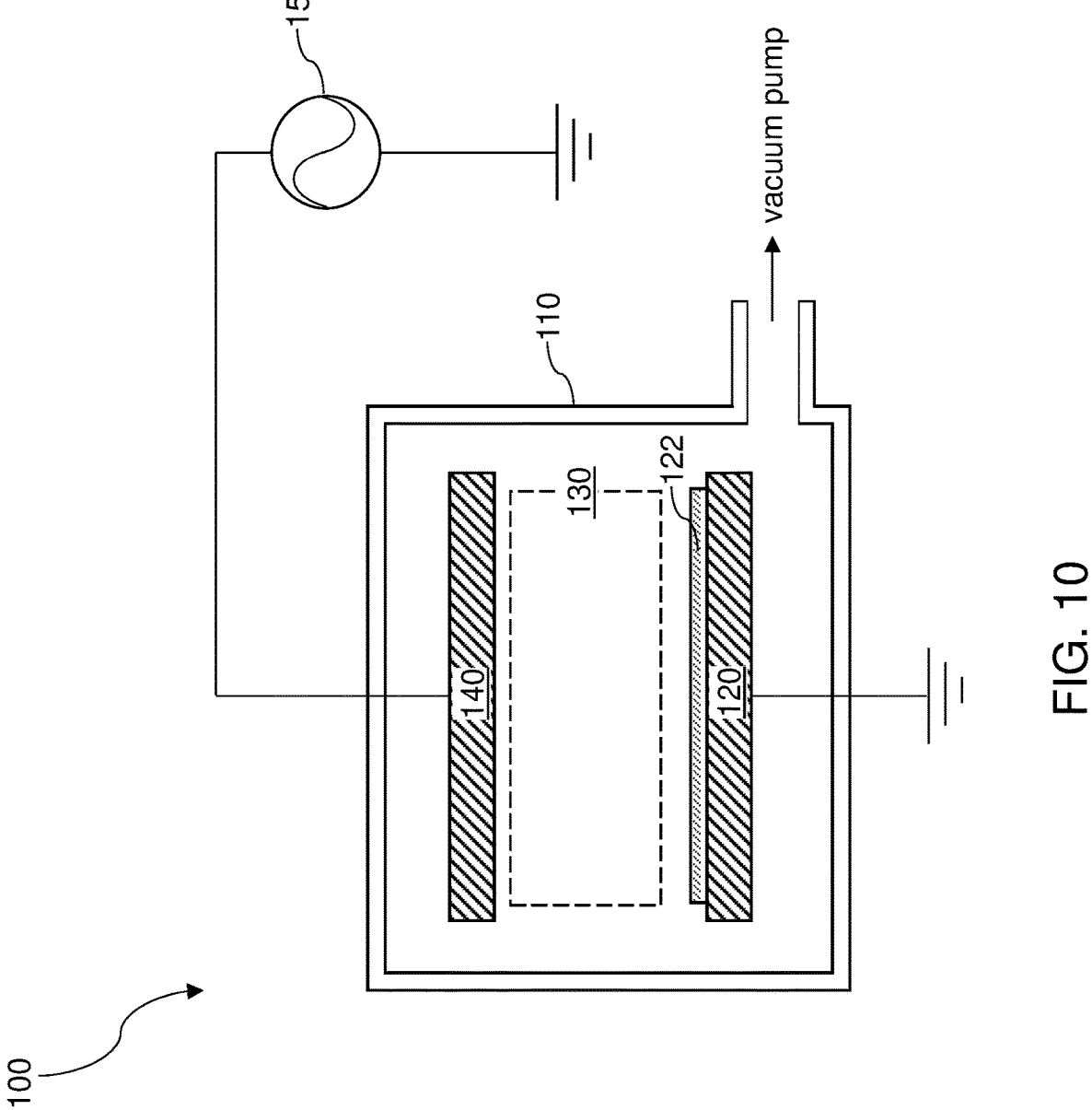
FIG. 10 is a vertical cross-sectional view of an apparatus for performing the third anisotropic etch process according to an embodiment of the present disclosure.

Referring to FIG. 10, an exemplary apparatus 100 for performing the third anisotropic etch process of the present disclosure is illustrated. The exemplary apparatus comprises an etch chamber that includes a vacuum enclosure 110 in which a top electrode (an RF electrode) 140 and a bottom electrode (a ground electrode) 120 are provided. An RF signal generator 150 may be attached to the top electrode 140 to generate a plasma 130 of gases supplied into the vacuum enclosure through mass flow controllers (not illustrated). The inside of the vacuum enclosure 110 may be connected to a vacuum pump that may be used to control the pressure at which the various anisotropic etch steps of the third anisotropic etch process may be performed. A substrate 122 that includes the structures discussed above with reference to FIGS. 5A, 5B, 6A, 6B, 7A, and 7B may be placed in the vacuum enclosure to perform the anisotropic etch process.

Figure 11A:
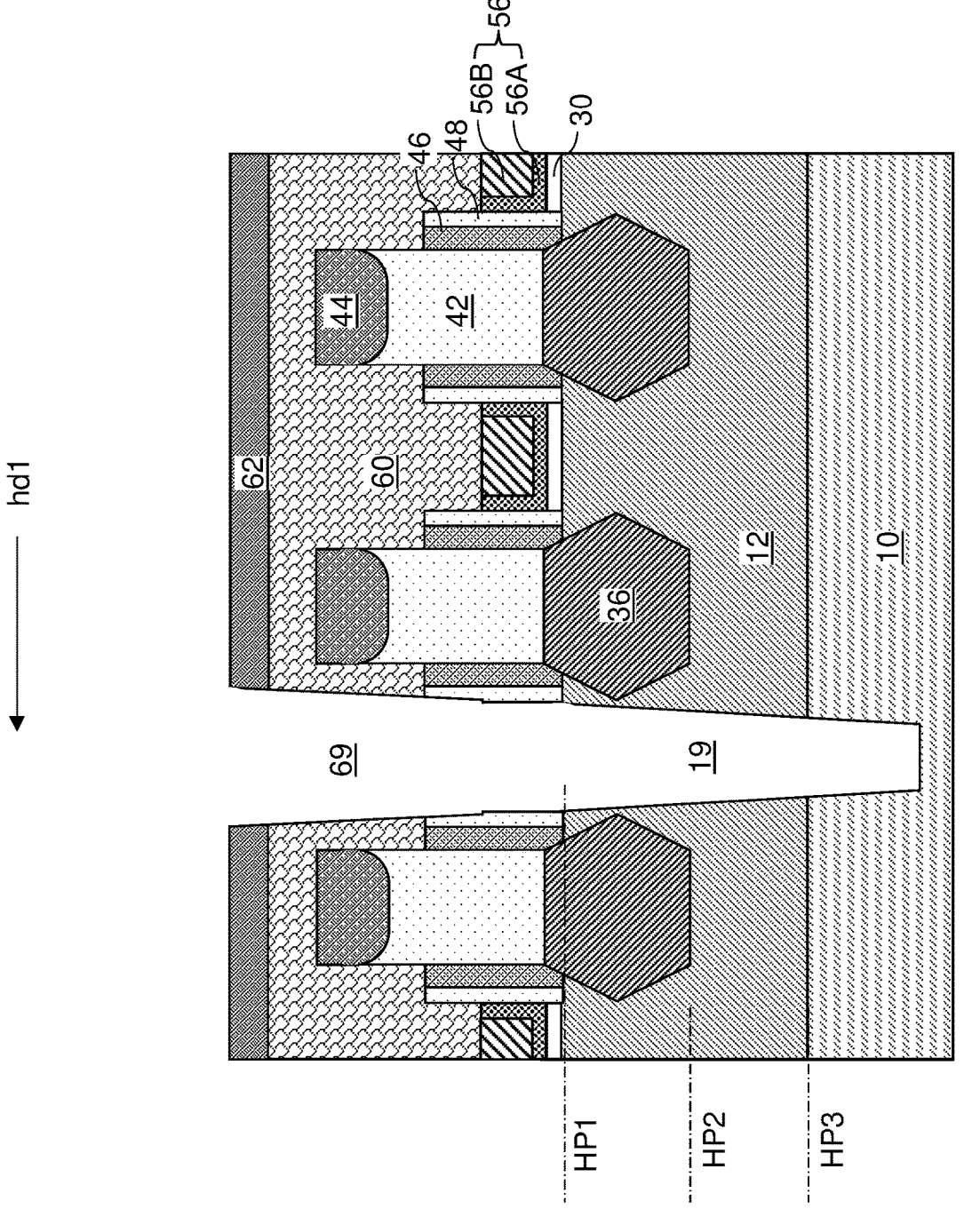
FIG. 11A is a first vertical cross-sectional view of the intermediate structure after removing etch residues from trenches along a vertical plane that is parallel to the first horizontal direction according to an embodiment of the present disclosure.
Figure 11B:
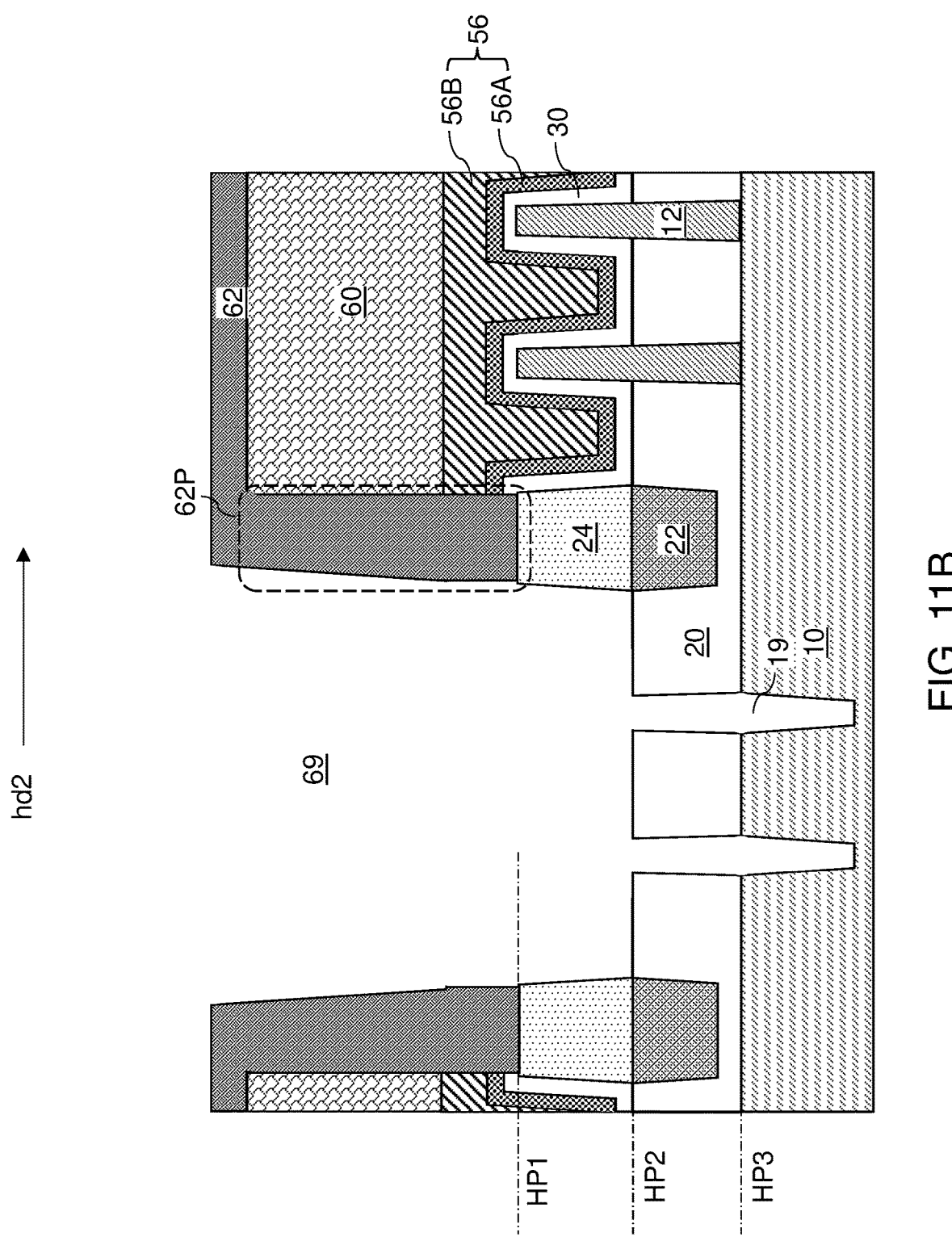
FIG. 11B is a second vertical cross-sectional view of the intermediate structure of FIG. 11A along a vertical plane that is parallel to the second horizontal direction according to an embodiment of the present disclosure.

Referring to FIGS. 11A and 11B, a clean process may be performed to remove the continuous etch residue layer 17 after the third anisotropic etch process.

Figure 12A:
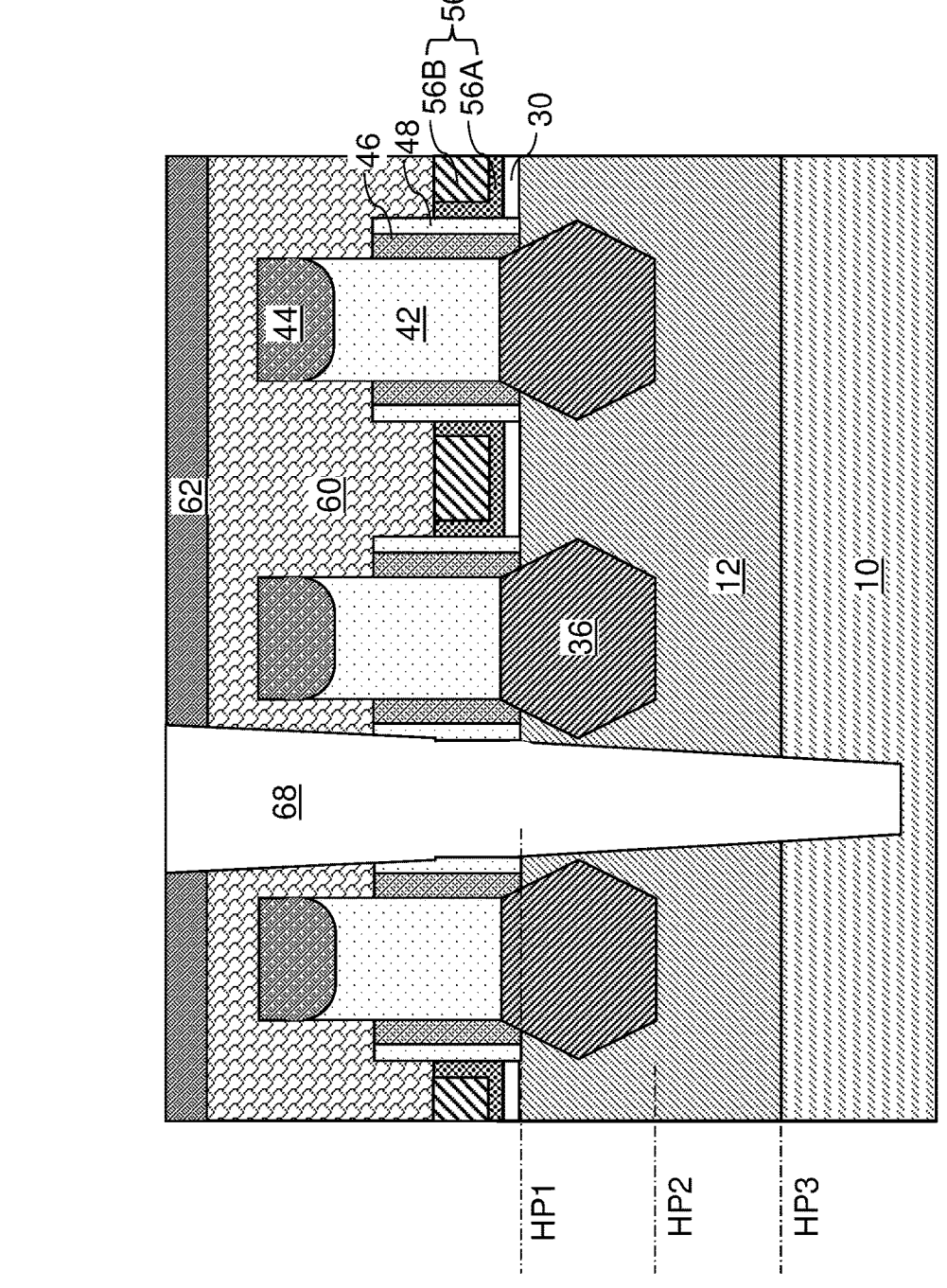
FIG. 12A is a first vertical cross-sectional view of the intermediate structure after formation of dielectric fill structures along a vertical plane that is parallel to the first horizontal direction according to an embodiment of the present disclosure.
Figure 12B:
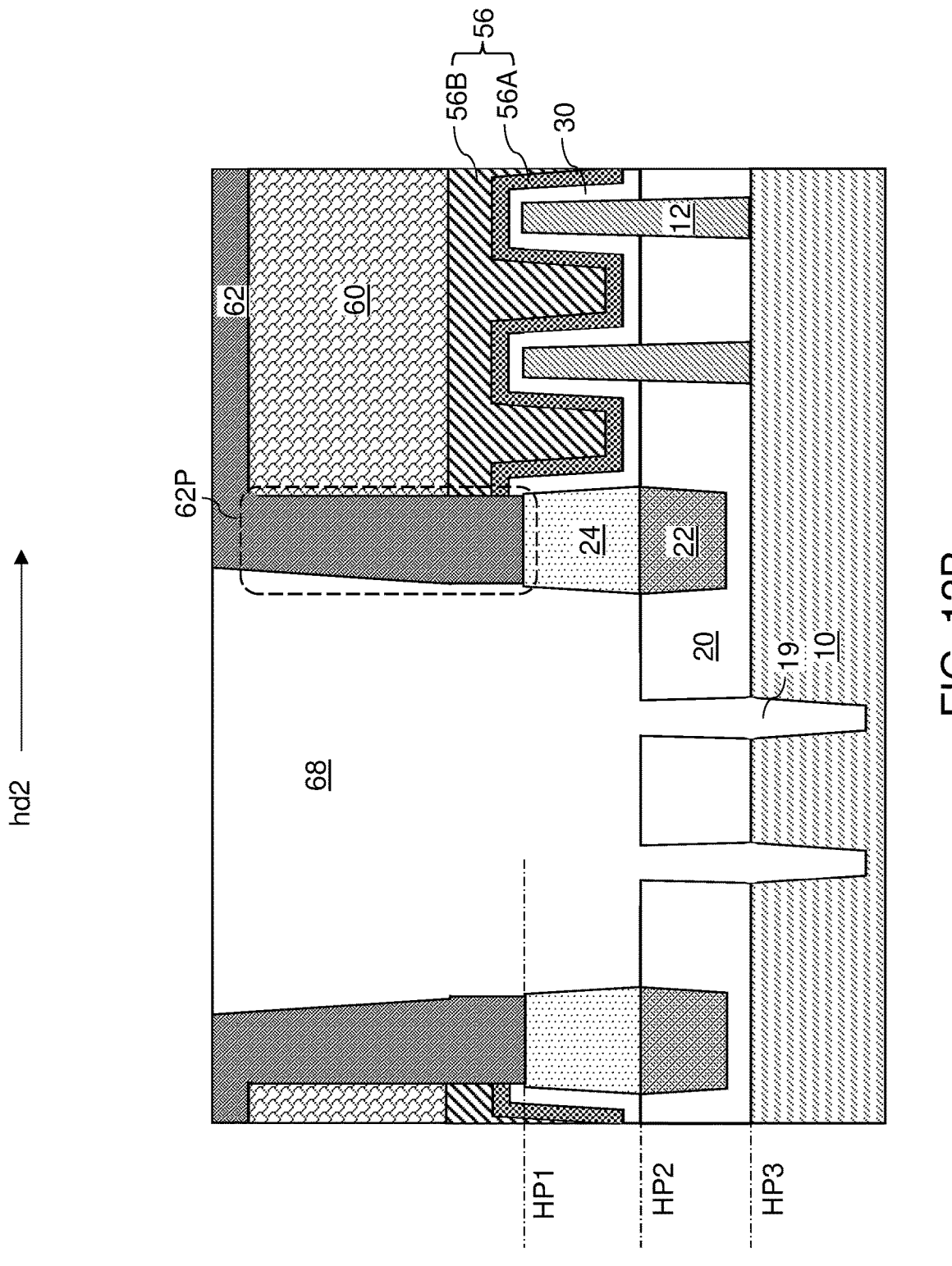
FIG. 12B is a second vertical cross-sectional view of the intermediate structure of FIG. 12A along a vertical plane that is parallel to the second horizontal direction according to an embodiment of the present disclosure.

Referring to FIGS. 12A and 12B, at least one dielectric fill material such as silicon oxide may be deposited in the trenches 19 and the via cavities 69, and excess portions of the at least one dielectric material may be removed from above the topmost surface of the dielectric mask layer 62. Each remaining portion of the at least one dielectric fill material constitutes a dielectric fill structure 68.

Figure 13A:
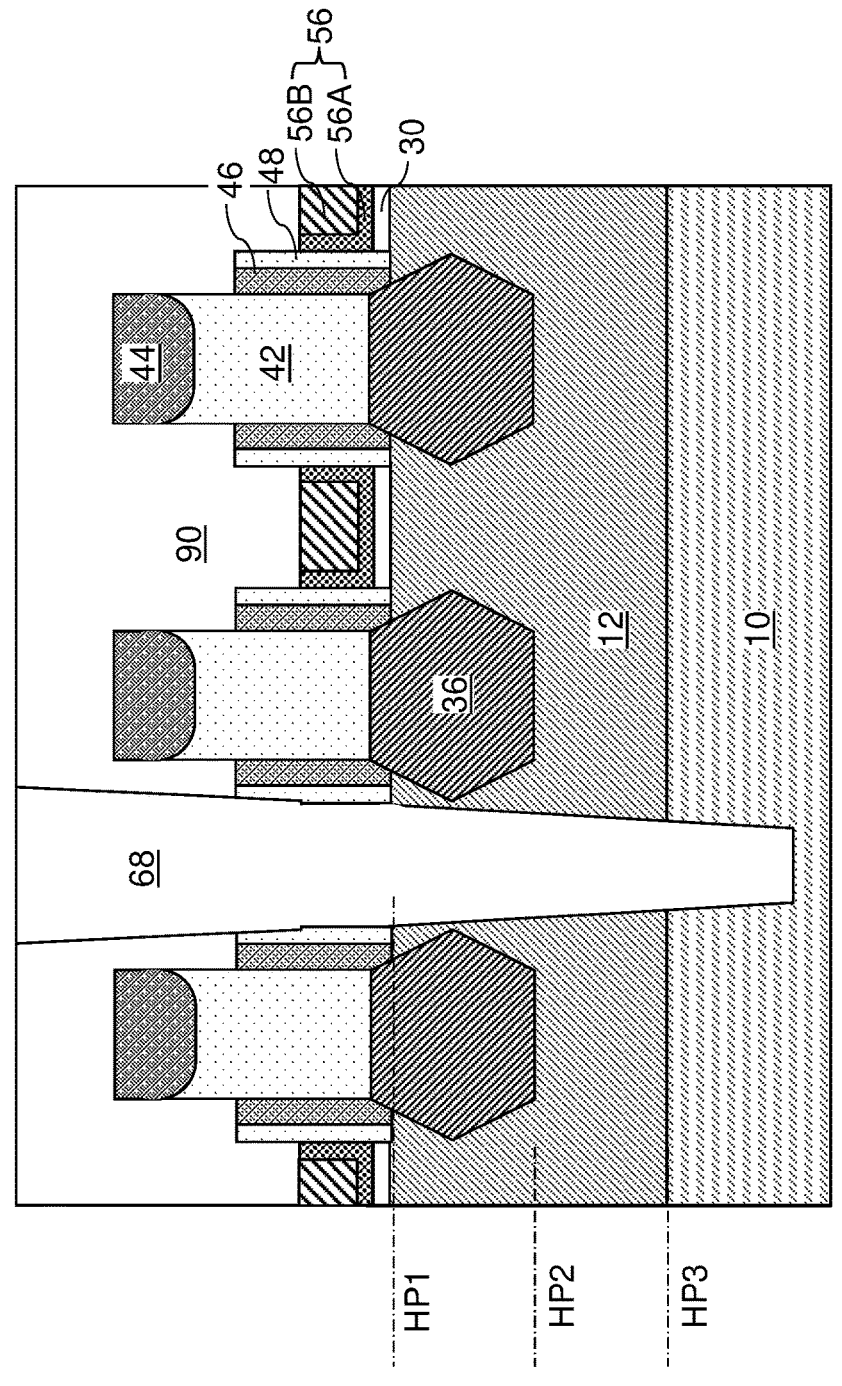
FIG. 13A is a first vertical cross-sectional view of the structure after replacement of the silicon layer and a horizontally-extending portion of the dielectric mask layer along a vertical plane that is parallel to the first horizontal direction according to an embodiment of the present disclosure.
Figure 13B:
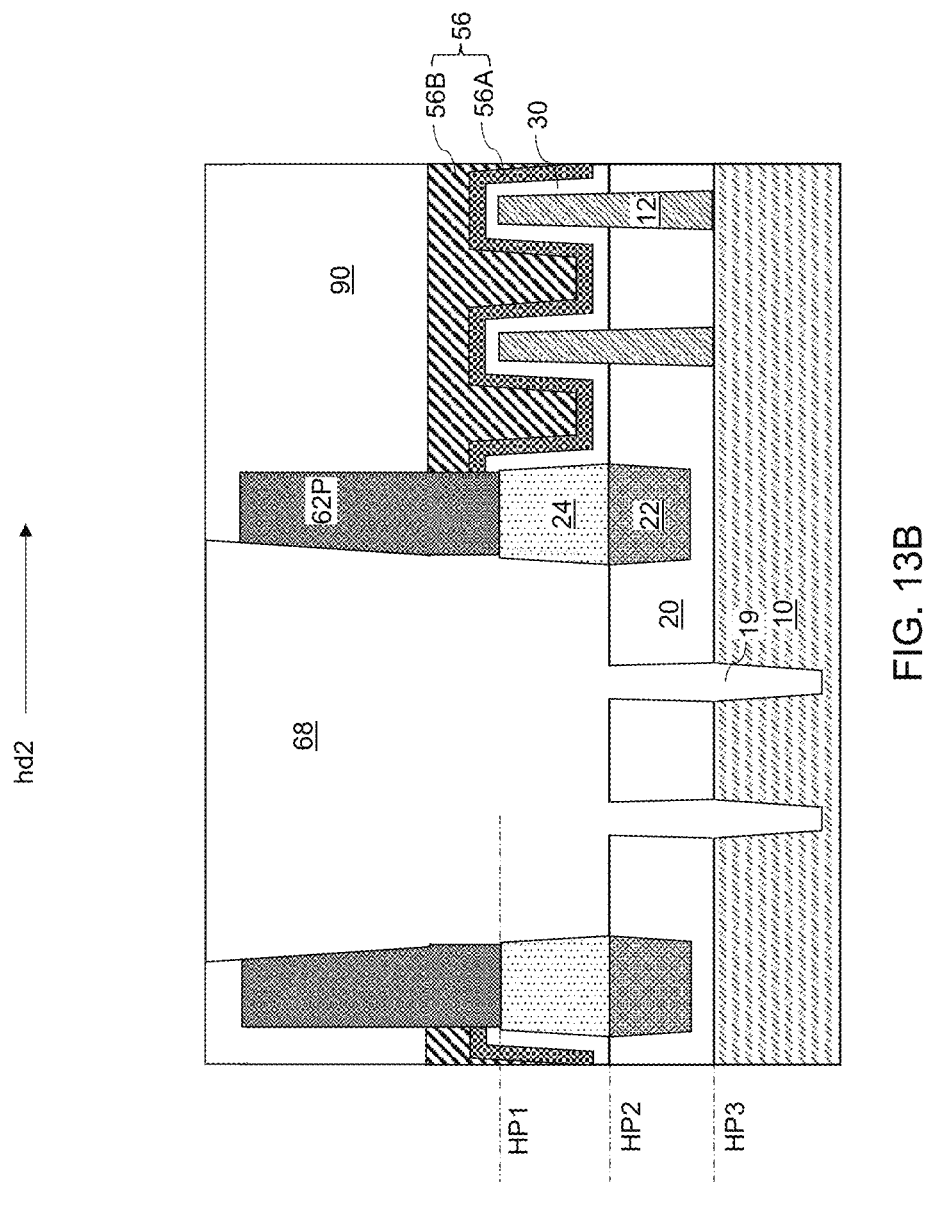
FIG. 13B is a second vertical cross-sectional view of the structure of FIG. 13A along a vertical plane that is parallel to the second horizontal direction according to an embodiment of the present disclosure.

Referring to FIGS. 13A and 13B, dielectric material, such as SiN or SiO, is deposited to form insulation layers between source and drain. A following chemical mechanical polishing (CMP) process and a silicon etch process can planarize the wafer surface and remove excess portions of dielectric material, such as the silicon nitride rail 44. A contact-level dielectric layer 90 can be formed. Suitable contact via structures (not shown) may be formed through the contact-level dielectric layer 90 on a respective electrical node of the fin field effect transistors.

Referring to FIG. 14, a first flow chart illustrates a first sequence of processing steps according to an embodiment of present disclosure.

Referring to step 1410 and FIGS. 1A-1C, semiconductor fins 12 may be formed over a semiconductor substrate 10.

Referring to step 1420 and FIGS. 1A-1C, gate dielectric layers 30 may be formed over the semiconductor fins 12.

Referring to step 1430 and FIGS. 1A-1C, gate electrodes 56 may be formed over the gate dielectric layers 30.

Referring to step 1440 and FIGS. 1A-1C, a silicon layer 60 may be formed over the gate electrodes 56.

Referring to step 1450 and FIGS. 1A-3C, a dielectric mask layer 62 including openings may be formed over the silicon layer 60.

Referring to step 1460 and FIGS. 3A-3C and 9A-9D, portions of the silicon layer 60 that underlie the openings in the dielectric mask layer 62 may be etched by performing a first anisotropic etch process.

Referring to step 1470 and FIGS. 4A-4C and 9A-9D, portions of the gate electrodes 56 that underlie the openings in the dielectric mask layer 62 may be removed by performing a second anisotropic etch process.

Referring to step 1480 and FIGS. 5A-7B and 9A-9D, portions of the semiconductor fins 12 and portions of the semiconductor substrate 10 that underlie the openings in the dielectric mask layer 62 may be removed by performing a third anisotropic etch process that uses a plasma of a gas mixture comprising hydrogen bromide gas. At least one anisotropic etch step within the third anisotropic etch process comprises at least one low pressure etch step that is performed at a total pressure in a range from 5 mTorr to 50 mTorr.

Referring to FIG. 15, a second flow chart illustrates a second sequence of processing steps according to an embodiment of present disclosure.

Referring to step 1510 and FIGS. 1A-1C, semiconductor fins 12 may be formed over a semiconductor substrate 10.

Referring to step 1520 and FIGS. 1A-1C, a gate dielectric layer 30 and gate electrodes 56 may be formed over the semiconductor fins 12.

Referring to step 1530 and FIGS. 1A-1C, a silicon layer 60 may be formed over the gate electrodes 56.

Referring to step 1540 and FIGS. 3A-3C and 9A-9D, a first anisotropic etch process may be performed, which etches portions of the silicon layer 60 that are not masked by an etch mask to form via cavities 69.

Referring to step 1550 and FIGS. 4A-4C and 9A-9D, a second anisotropic etch process may be performed, which extends the via cavities 69 downward by etching portions of the gate electrodes 56.

Referring to step 1560 and FIGS. 5A-7B and 9A-9D, a third anisotropic etch process may be performed, which etches portions of the semiconductor fins 12 and portions of the semiconductor substrate 10 that underlie the via cavities 69. The third anisotropic etch process comprises at least one low pressure etch step using a plasma of a gas mixture comprising hydrogen bromide gas at a total pressure in a range from 5 mTorr to 50 mTorr.

Referring to FIG. 16, a third flow chart illustrates a third sequence of processing steps according to an embodiment of present disclosure.

Referring to step 1610 and FIGS. 1A-1C, semiconductor fins 12 may be formed over a semiconductor substrate 10.

Referring to step 1620 and FIGS. 1A-1C, a silicon layer 60 may be formed over the semiconductor fins 12.

Referring to step 1630 and FIGS. 1A-1C, discrete openings through the silicon layer 60.

Referring to step 1640 and FIGS. 1A-1C, a dielectric mask layer 62 may be formed over the silicon layer 60. The dielectric mask layer 62 comprises dielectric pillar portions 62P that fill the discrete openings.

Referring to step 1650 and FIGS. 2A-3C and 9A-9D, an opening may be formed through the dielectric mask layer 62.

Referring to step 1660 and FIGS. 3A-3C and 9A-9D, a via cavity 69 by etching portions of the silicon layer 60 that underlie the opening through the dielectric mask layer 62. Sidewalls of a pair of dielectric pillar portions 62P are physically exposed to the via cavity 69.

Referring step 1670 and FIGS. 4A-7B and 9A-9D, an anisotropic etch process may be performed, which etches portions of the semiconductor fins 12 and portions of the semiconductor substrate 10 that underlie the via cavity 69. The anisotropic etch process comprises at least one low pressure etch step using a plasma of a gas mixture comprising hydrogen bromide gas at a total pressure in a range from 5 mTorr to 50 mTorr.

The various embodiments of the present disclosure may be used to cut semiconductor fins 12 and to form trenches 19 between neighboring pairs of cut semiconductor fins 12 such that the depth of the trenches 19 is uniform irrespective of the pattern factor of the cut areas, i.e., the pattern factor of the areas of the via cavities 69. Thus, greater flexibility in the layout of the fin field effect transistors may be provided by embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming semiconductor fins over a semiconductor substrate;

forming a gate dielectric layer over the semiconductor fins;

forming gate electrodes over the gate dielectric layer;

forming a silicon layer over the gate electrodes;

forming a dielectric mask layer including openings over the silicon layer;

etching portions of the silicon layer that underlie the openings in the dielectric mask layer by performing a first anisotropic etch process;

etching portions of the gate electrodes that underlie the openings in the dielectric mask layer by performing a second anisotropic etch process; and removing portions of the semiconductor fins and portions of the semiconductor substrate that underlie the openings in the dielectric mask layer are removed by performing a third anisotropic etch process that uses a plasma of a gas mixture comprising hydrogen bromide gas, and wherein:

at least one anisotropic etch step within the third anisotropic etch process comprises at least one low pressure etch step that is performed at a total pressure in a range from 5 mTorr to 50 mTorr; and during the at least one low pressure etch step, the gas mixture comprises oxygen gas, and a ratio of a flow rate of the oxygen gas to a flow rate of the hydrogen bromide gas is in a range from 0.2 to 0.5.

2. The method of claim 1, wherein the oxygen gas has a partial pressure in a range from 2 mTorr to 10 mTorr during the at least one low pressure etch step.

3. The method of claim 1, wherein, during the at least one low pressure etch step:

the gas mixture comprises oxygen gas;

trenches are formed in the semiconductor substrate; and a flow rate of the oxygen gas is selected such that a continuous etch residue layer is formed on sidewalls of the trenches.

4. The method of claim 3, wherein, during the at least one low pressure etch step:

the continuous etch residue layer comprises a mixture of a polymer residue material and a silicon oxide residue material; and a molar fraction of the silicon oxide residue material within the continuous etch residue layer is in a range from 0.7 to 0.999.

5. The method of claim 3, wherein the continuous etch residue layer has an average thickness in a range from 0.3 nm to 0.8 nm.

6. The method of claim 1, wherein:

the at least one low pressure etch step simultaneously generates a polymer residue material and a silicon oxide residue material;

a removal rate of the polymer residue material is in a range from 80% to 100% of a generation rate of the polymer residue material; and a removal rate of the silicon oxide residue material is in a range from 1% to 50% of a generation rate of the silicon oxide residue material.

7. The method of claim 1, further comprising using electron cyclotron resonance (ECR) to strike the plasma of the gas mixture.

8. The method of claim 1, further comprising forming a shallow trench isolation structure around the semiconductor fins such that a top surface of the shallow trench isolation structure is formed below a first horizontal plane including top surfaces of the semiconductor fins, wherein the third anisotropic etch process etches a material of the semiconductor fins and a material of the semiconductor substrate selective to a material of the shallow trench isolation structure.

9. The method of claim 8, wherein the third anisotropic etch process comprises:

a first step during which first portions of the semiconductor fins that underlie the first horizontal plane including the top surface of the shallow trench isolation structure are removed;

a second step during which second portions of the semiconductor fins that underlie a second horizontal plane and overlie a third horizontal plane including a top surface of the semiconductor substrate are removed; and a third step during which the portions of the semiconductor substrate underlying the third horizontal plane are removed.

10. The method of claim 9, wherein the at least one low pressure etch step comprises at least the third step.

11. The method of claim 10, wherein the first step is performed at another total pressure that is higher than the total pressure.

12. A method of forming a semiconductor structure, comprising:

forming semiconductor fins over a semiconductor substrate;

forming gate electrodes over the semiconductor fins;

forming a silicon layer over the gate electrodes;

performing a first anisotropic etch process that etches portions of the silicon layer that are not masked by an etch mask to form via cavities;

performing a second anisotropic etch process that extends the via cavities downward by etching portions of the gate electrodes; and performing a third anisotropic etch process that etches portions of the semiconductor fins and portions of the semiconductor substrate that underlie the via cavities, wherein:

the third anisotropic etch process comprises at least one low pressure etch step using a plasma of a gas mixture comprising hydrogen bromide gas at a total pressure in a range from 5 mTorr to 50 mTorr;

the third anisotropic etch process simultaneously generates a polymer residue material and a silicon oxide residue material.

13. The method of claim 12, wherein, during the at least one low pressure etch step:

the gas mixture comprises oxygen gas;

trenches are formed in the semiconductor substrate; and a flow rate of the oxygen gas is selected such that a continuous etch residue layer is formed on sidewalls of the trenches.

14. The method of claim 13, wherein:

the continuous etch residue layer comprises a mixture of a polymer residue material and a silicon oxide residue material; and a molar fraction of the silicon oxide residue material within the continuous etch residue layer is in a range from 0.7 to 0.999.

15. The method of claim 12, wherein:

a removal rate of the polymer residue material is in a range from 80% to 100% of a generation rate of the polymer residue material; and a removal rate of the silicon oxide residue material is in a range from 1% to 50% of a generation rate of the silicon oxide residue material.

16. The method of claim 12, wherein, during the at least one low pressure etch step, the gas mixture comprises oxygen gas, and a ratio of a flow rate of the oxygen gas to a flow rate of the hydrogen bromide gas is in a range from 0.2 to 0.5.

17. A method of forming a semiconductor structure, comprising:

forming semiconductor fins over a semiconductor substrate;

forming a silicon layer over the semiconductor fins;

forming discrete openings through the silicon layer;

forming a dielectric mask layer over the silicon layer, wherein the dielectric mask layer comprises dielectric pillar portions that fill the discrete openings;

forming an opening through the dielectric mask layer;

forming a via cavity by etching portions of the silicon layer that underlie the opening through the dielectric mask layer, wherein sidewalls of a pair of the dielectric pillar portions are physically exposed to the via cavity; and performing an anisotropic etch process that etches portions of the semiconductor fins and portions of the semiconductor substrate that underlie the via cavity, wherein the anisotropic etch process comprises at least one low pressure etch step using a plasma of a gas mixture comprising hydrogen bromide gas at a total pressure in a range from 5 mTorr to 50 mTorr.

18. The method of claim 17, further comprising forming a shallow trench isolation structure around the semiconductor fins such that a top surface of the shallow trench isolation structure is formed below a first horizontal plane including top surfaces of the semiconductor fins, wherein the anisotropic etch process etches a material of the semiconductor fins and a material of the semiconductor substrate selective to a material of the shallow trench isolation structure.

19. The method of claim 18, wherein the third anisotropic etch process comprises:

a first step during which first portions of the semiconductor fins that overlie the first horizontal plane including the top surface of the shallow trench isolation structure are removed;

a second step during which second portions of the semiconductor fins that underlie the first horizontal plane and overlie a second horizontal plane including a top surface of the semiconductor substrate are removed; and a third step during which the portions of the semiconductor substrate are removed.

20. The method of claim 19, wherein:

the at least one low pressure etch step comprises at least the third step; and the first step is performed at another total pressure that is higher than the total pressure.

* * * * *